United States Patent
Tomita et al.

(10) Patent No.: US 12,335,203 B2
(45) Date of Patent: Jun. 17, 2025

(54) RADIO FREQUENCY MODULE, COMMUNICATION DEVICE, RADIO FREQUENCY CIRCUIT, AND TRACKER MODULE

(71) Applicant: Murata Manufacturing Co., Ltd., Nagaokakyo (JP)

(72) Inventors: Naohide Tomita, Nagaokakyo (JP); Takeshi Kogure, Nagaokakyo (JP)

(73) Assignee: MURATA MANUFACTURING CO., LTD., Nagaokakyo (JP)

( * ) Notice: Subject to any disclaimer, the term of this patent is extended or adjusted under 35 U.S.C. 154(b) by 409 days.

(21) Appl. No.: 18/055,970

(22) Filed: Nov. 16, 2022

(65) Prior Publication Data

US 2023/0076829 A1  Mar. 9, 2023

Related U.S. Application Data

(63) Continuation of application No. PCT/JP2021/020863, filed on Jun. 1, 2021.

(30) Foreign Application Priority Data

Jun. 10, 2020  (JP) .................................. 2020-101198

(51) Int. Cl.
*H04L 5/14*  (2006.01)

(52) U.S. Cl.
CPC ..................... *H04L 5/14* (2013.01)

(58) Field of Classification Search
CPC ........ H03F 1/0211; H03F 3/211; H03F 3/245; H04B 1/04; H04L 5/0028; H04L 5/14; H04L 5/143; H04L 5/1469
See application file for complete search history.

(56) References Cited

U.S. PATENT DOCUMENTS

2012/0146731 A1  6/2012  Khesbak
2014/0118063 A1  5/2014  Briffa et al.
(Continued)

FOREIGN PATENT DOCUMENTS

JP  2014502808 A  2/2014
JP  2015533066 A  11/2015
(Continued)

OTHER PUBLICATIONS

English translation of the Written Opinion of the International Searching Authority, International application No. PCT/JP2021/020863, mailed on Aug. 24, 2021 (Year: 2021).*

(Continued)

*Primary Examiner* — Nader Bolourchi
(74) *Attorney, Agent, or Firm* — ArentFox Schiff LLP

(57) ABSTRACT

A radio frequency module is provided that includes a plurality of power amplifiers, an external connection terminal, a filter, and a switch. The amplifiers include a first power amplifier and a second power amplifier. The external connection terminal is connected to a tracker component configured to supply a power supply voltage to the power amplifiers. Moreover, the filter is not disposed on a first path between the external connection terminal and the first power amplifier, but instead it is disposed on a second path between the external connection terminal and the second power amplifier. The switch is configured to switch connection to the external connection terminal between the first path and the second path.

20 Claims, 13 Drawing Sheets

(56) References Cited

U.S. PATENT DOCUMENTS

2015/0084698 A1  3/2015  Ito et al.
2019/0131941 A1  5/2019  Ishihara et al.

FOREIGN PATENT DOCUMENTS

JP    2019083476 A    5/2019
WO    2013176147 A1   11/2013

OTHER PUBLICATIONS

International Search Report in PCT/JP2021/020863, mailed on Aug. 24, 2021, 3 pages.

* cited by examiner

RADIO FREQUENCY MODULE, COMMUNICATION DEVICE, RADIO FREQUENCY CIRCUIT, AND TRACKER MODULE

CROSS REFERENCE TO RELATED APPLICATIONS

This application is a continuation of PCT Application No. PCT/JP2021/020863, filed Jun. 1, 2021, which claims priority to Japanese Patent Application No. 2020-101198, filed Jun. 10, 2020, the entire contents of each of which are hereby incorporated by reference in their entirety.

FIELD OF THE INVENTION

The present invention generally relates to radio frequency (RF) modules, communication devices, radio frequency (RF) circuits, and tracker modules. More specifically, the present invention relates to an RF module including a plurality of power amplifiers (PAs) and a filter, a communication device including the RF module, an RF circuit including a filter, and a tracker module including a filter.

BACKGROUND

In recent years, PA circuits employing an envelope tracking method (hereinafter referred to as an "ET method") have been known, for example, as described in International Publication No. 2013/176147. The ET method is an RF amplification technique of changing the amplitude of the power supply voltage for an amplifier element in accordance with the amplitude of the envelope of an RF signal. More specifically, the ET method is a technique of changing the collector voltage of an amplifier element in accordance with an output voltage, thereby reducing power loss generated during operation when the power supply voltage is fixed, and achieving higher efficiency.

The PA circuit described in International Publication No. 2013/176147 includes a transistor that amplifies a signal input to the base and outputs the amplified signal from the collector. Moreover, the power supply voltage for the transistor is changed in accordance with the amplitude of the envelope of an RF signal, and is supplied to the transistor.

In the PA circuit described in International Publication No. 2013/176147, a filter is connected to a path between a tracker component and a PA in order to reduce harmonic components of a power supply voltage from the tracker component.

However, in the PA circuit described in International Publication No. 2013/176147, when a common path is used to supply a power supply voltage to a PA supporting a plurality of communication bands, the power supply voltage for the PA passes through a filter having characteristics that are the same in all the communication bands. This configuration creates an issue that it is difficult to achieve both low loss and a favorable attenuation characteristic in some communication bands.

SUMMARY OF THE INVENTION

Accordingly, it is an object of the present invention to provide a radio frequency module, a communication device, a radio frequency circuit, and a tracker module that achieves both low loss and a favorable attenuation characteristic in each of a plurality of communication bands.

In an exemplary aspect, a radio frequency module is provided that includes a plurality of power amplifiers, an external connection terminal, a filter, and a switch. The plurality of power amplifiers include at least a first power amplifier and a second power amplifier. The external connection terminal is connected to a tracker component configured to supply a power supply voltage to the plurality of power amplifiers. Moreover, the filter is not disposed on a first path between the external connection terminal and the first power amplifier, but it is instead disposed on a second path between the external connection terminal and the second power amplifier. The switch is configured to switch connection to the external connection terminal between the first path and the second path.

In another exemplary aspect, a communication device is provided that includes the radio frequency module and a signal processing circuit. The signal processing circuit is configured to output a radio frequency signal to the radio frequency module.

According to another exemplary aspect, a radio frequency circuit is provided that includes a plurality of power amplifiers, an external connection terminal, a filter, and a switch. The plurality of power amplifiers include at least a first power amplifier and a second power amplifier. The external connection terminal is connected to a tracker circuit configured to supply a power supply voltage to the plurality of power amplifiers. Moreover, the filter is not disposed on a first path between the external connection terminal and the first power amplifier, but instead it is disposed on a second path between the external connection terminal and the second power amplifier. The switch is configured to switch connection to the external connection terminal between the first path and the second path.

According to another exemplary aspect, a tracker module is provided that includes a tracker, a filter, and a switch. The tracker has an output terminal and is configured to supply a power supply voltage to a first power amplifier and a second power amplifier. The filter is not disposed on a first path between the output terminal of the tracker and the first power amplifier, but it is instead disposed on a second path between the output terminal of the tracker and the second power amplifier. The switch is configured to switch connection to the output terminal of the tracker between the first path and the second path.

With the radio frequency module, the communication device, the radio frequency circuit, and the tracker module according to the above exemplary aspects, both low loss and a favorable attenuation characteristic can be achieved in each of a plurality of communication bands.

DETAILED DESCRIPTION OF EMBODIMENTS

Hereinafter, a radio frequency (RF) module and a communication device according to a first exemplary embodiment, and a tracker module according to a second exemplary embodiment will be described with reference to the drawings. It is noted that the individual figures referred to in the following embodiments and the like are schematic diagrams. The sizes and thicknesses of the individual components in the figures, and the ratios thereof do not necessarily reflect the actual dimensional ratios.

First Exemplary Embodiment

RF Module

The configuration of an RF module 1 according to the first exemplary embodiment will be described with reference to the drawings.

Figure 1:
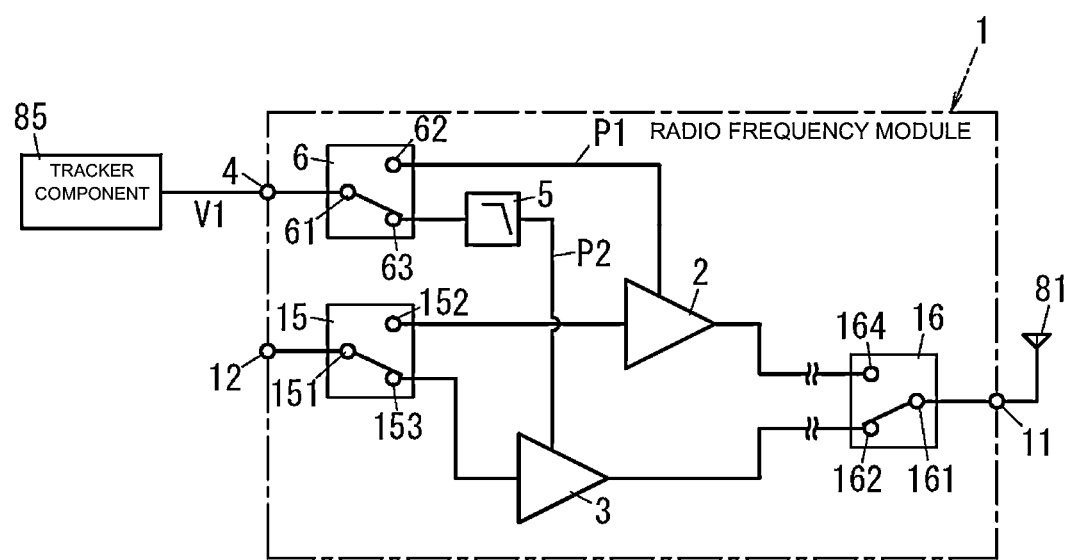
FIG. 1 is a schematic diagram illustrating the configuration of a main part of a radio frequency (RF) module according to a first exemplary embodiment.
Figure 2:
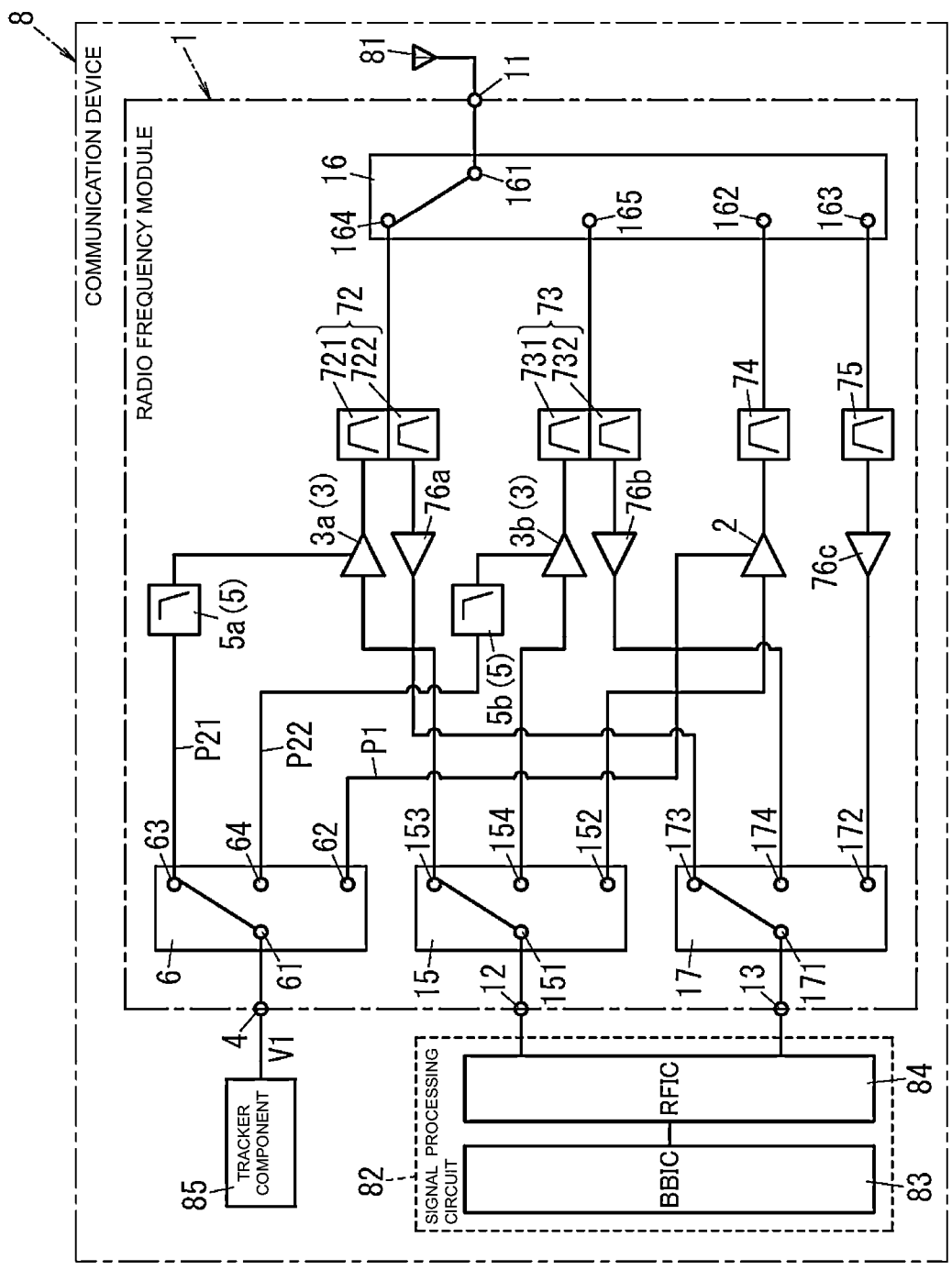
FIG. 2 is a schematic diagram illustrating the configuration of the RF module and a communication device according to the first exemplary embodiment.

As illustrated in FIG. 1, the RF module 1 includes a plurality of power amplifiers (PAs), that is, a first PA 2 and a second PA 3; an external connection terminal 4; a filter 5; and a switch 6 (e.g., a first switch). The RF module 1 further includes an antenna terminal 11, an input terminal 12, a transmission switch 15 (e.g., a second switch), and an antenna switch 16 (e.g., a third switch). An RF signal output from the RF module 1 is transmitted to a base station (not illustrated) via an antenna 81, which will be described below. The RF module 1 is used for a communication device 8 or the like, as illustrated in FIG. 2.

In the RF module 1, an envelope tracking method (hereinafter referred to as an "ET method") is used to amplify an RF signal. According to the exemplary aspect, the ET method includes an analog envelope tracking method (hereinafter referred to as an "analog ET method") and a digital envelope tracking method (hereinafter referred to as a "digital ET method").

The analog ET method is a method of continuously assigning the amplitude level of the power supply voltage for a PA (amplifier element) in accordance with the envelope of the amplitude of an RF signal input to the PA (amplifier element). In the analog ET method, the envelope is continuously detected, and thus the amplitude level of the power supply voltage continuously changes.

The digital ET method is a method of discretely supplying power supply voltages in amplitude levels to a PA (amplifier element) in accordance with the envelope of the amplitude of an RF signal input to the PA (amplifier element). In the digital ET method, the voltage level of the power supply voltage is selected from among a plurality of discrete voltage levels in response to a digital control signal corresponding to an envelope signal, and changes with time. The envelope signal is a signal indicating the envelope value of a modulated wave (RF signal). In an exemplary aspect, the envelope value is, for example, $(I^2+Q^2)^{1/2}$. (I, Q) represents a constellation point herein. The constellation point is a point representing, on a constellation diagram, a signal modulated by digital modulation.

(2) Communication Device

Next, the communication device 8 including the RF module 1 will be described with reference to the drawings.

As illustrated in FIG. 2, the communication device 8 includes the RF module 1, the antenna 81, a signal processing circuit 82, and a tracker component 85. The communication device 8 is, for example, a mobile phone, such as a smartphone or the like. It is noted that the communication device 8 is not limited to a mobile phone, and may be, for example, a wearable terminal such as a smart watch. In other words, the communication device 8 corresponds to user equipment (UE) in a cellular network, and is typically a mobile phone, a smartphone, a tablet computer, a wearable device, or the like. The communication device 8 may be an Internet of Things (IoT) sensor device, a medical/health-care device, a vehicle, an unmanned aerial vehicle (UAV) (a so-called drone), or an automated guided vehicle (AGV).

In operation, the communication device 8 is configured to perform communication in a first communication band and communication in a second communication band. More specifically, the communication device 8 transmits a transmission signal of the first communication band (hereinafter referred to as a "first transmission signal") and receives a reception signal of the first communication band (hereinafter referred to as a "first reception signal"). Furthermore, the communication device 8 transmits a transmission signal of the second communication band (hereinafter referred to as a "second transmission signal") and receives a reception signal of the second communication band (hereinafter referred to as a "second reception signal").

The first transmission signal and the first reception signal are time division duplex (TDD) signals. The first transmission signal and the first reception signal are not limited to TDD signals, and may be frequency division duplex (FDD) signals. TDD is a wireless communication technique in which the same frequency band is allocated to the uplink and downlink in wireless communication, and transmission and reception are performed in different time slots. FDD is a wireless communication technique in which transmission and reception are performed with different frequency bands being allocated to the uplink and downlink in wireless communication.

The second transmission signal and the second reception signal are FDD signals. The second transmission signal and the second reception signal are not limited to FDD signals, and may be TDD signals.

(3) Circuit Configuration of RF Module

Hereinafter, the circuit configuration of the RF module 1 according to the first embodiment will be described with reference to the drawings.

(3.1) First PA

The first PA 2 illustrated in FIG. 1 includes a transistor (e.g., an amplifier element), which is not illustrated.

The first PA 2 is an amplifier that amplifies a first transmission signal (e.g., a TDD transmission signal). More specifically, the first PA 2 is a PA that amplifies a transmission signal whose communication band is the mid band and a transmission signal whose communication band is the high band. The first PA 2 amplifies, as a transmission signal whose communication band is the high band, a transmission signal whose communication band is n41, which is a frequency band for 5th Generation New Radio (5G NR).

The transistor (not illustrated) of the first PA 2 is, for example, an NPN transistor, and is an amplifier element that amplifies an RF signal by being supplied with a power supply voltage V1. The transistor amplifies an RF signal output from an RF signal processing circuit 84 (see FIG. 2). The transistor has a collector electrically connected to the switch 6.

The transistor of the first PA 2 is supplied with the power supply voltage V1. The transistor has a base that receives an RF signal from the input terminal 12. To the collector of the transistor, the power supply voltage V1 controlled in accordance with the amplitude level of the RF signal is applied from the tracker component 85.

The ET method is used here as described above, and thus the amplitude level of the power supply voltage V1 supplied to the transistor of the first PA 2 changes in accordance with amplitude variations of the RF signal.

(3.2) Second PA

The second PA 3 illustrated in FIG. 1 includes a transistor (e.g., an amplifier element). The transistor of the second PA 3 is constituted by, for example, a heterojunction bipolar transistor (HBT).

The second PA 3 is an amplifier that amplifies a second transmission signal (e.g., a FDD transmission signal). More specifically, the second PA 3 is a PA that amplifies a transmission signal whose communication band is the mid band and a transmission signal whose communication band is the high band. The second PA 3 amplifies, as a transmission signal whose communication band is the high band, a transmission signal whose communication band is Band 30, which is a frequency band for 3rd Generation Partnership Project (3GPP).

The transistor (not illustrated) of the second PA 3 is, for example, an NPN transistor, and is an amplifier element that amplifies an RF signal by being supplied with the power supply voltage V1. The transistor amplifies an RF signal output from the RF signal processing circuit 84 (see FIG. 2). The transistor has a collector electrically connected to the filter 5.

The transistor of the second PA 3 is supplied with the power supply voltage V1. The transistor has a base that receives an RF signal from the input terminal 12. The filter 5 is connected to the collector of the transistor. To the collector of the transistor, the power supply voltage V1 controlled in accordance with the amplitude level of the RF signal is applied from the tracker component 85.

The ET method is used here as described above, and thus the amplitude level of the power supply voltage V1 supplied to the transistor of the second PA 3 changes in accordance with amplitude variations of the RF signal.

(3.3) External Connection Terminal

As illustrated in FIG. 1, the external connection terminal 4 is a terminal connected to the tracker component 85. The external connection terminal 4 is directly or indirectly connected to the tracker component 85. The power supply voltage V1 from the tracker component 85 is supplied to the first PA 2 or the second PA 3 via the external connection terminal 4.

(3.4) Filter

As illustrated in FIG. 1, the filter 5 disposed on a second path P2 between the switch 6 and the second PA 3. The filter 5 is, for example, a low pass filter, and reduces harmonic components of the power supply voltage V1. Accordingly, noise resulting from the power supply voltage V1 can be reduced.

Figure 3:
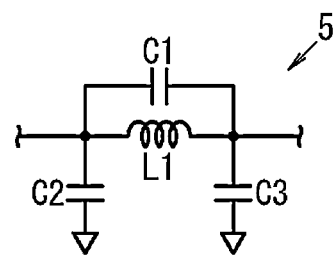
FIG. 3 is a circuit diagram of a filter of the RF module according to the first embodiment.

As illustrated in FIG. 3, the filter 5 includes an inductor L1, a first capacitor C1, a second capacitor C2, and a third capacitor C3. The first capacitor C1 is connected in parallel to the inductor L1. The second capacitor C2 is connected to the input side of the inductor L1. More specifically, the second capacitor C2 is connected between the ground and a path between the switch 6 and the inductor L1. The third capacitor C3 is connected to the output side of the inductor L1. More specifically, the third capacitor C3 is connected between the ground and a path between the inductor L1 and the second PA 3. The filter 5 is a so-called LC filter including an inductor and a capacitor as main components.

(3.5) Switch

As illustrated in FIG. 1, the switch 6 is a switch for switching the path to be connected to the external connection terminal 4. In other words, the switch 6 switches the path to be connected to the external connection terminal 4 between a first path P1 and the second path P2.

The switch 6 has a common terminal 61 and a plurality of (e.g., two in the illustrated example) selection terminals 62 and 63. The common terminal 61 is connected to the external connection terminal 4. The selection terminal 62 is connected to the first PA 2. The selection terminal 63 is connected to the second PA 3 via the filter 5.

The switch 6 is, for example, a switch configured to connect at least one of the plurality of selection terminals 62 and 63 to the common terminal 61. The switch 6 is, for example, a switch integrated circuit (IC). The switch 6 is, for example, controlled by the signal processing circuit 82 (see FIG. 2), which will be described below. The switch 6 switches the connection state between the common terminal 61 and the plurality of selection terminals 62 and 63 in response to a control signal from the RF signal processing circuit 84 (see FIG. 2) of the signal processing circuit 82.

(4) Additional Components of RF Module

The RF module 1 includes, in addition to the above-described components, a plurality of (e.g., two in the illustrated example) duplexers 72 and 73, a first transmission filter 74, a first reception filter 75, a plurality of (e.g., three in the illustrated example) low-noise amplifiers 76a to 76c, the transmission switch 15, the antenna switch 16, and a reception switch 17, as illustrated in FIG. 2. The RF module 1 further includes the antenna terminal 11, the input terminal 12, and an output terminal 13.

(4.1) Duplexers, First Transmission Filter, First Reception Filter

The first transmission filter 74 illustrated in FIG. 2 is a transmission filter that allows a first transmission signal to pass therethrough. The first transmission filter 74 is disposed, on a transmission path, between the first PA 2 and the antenna terminal 11. More specifically, the first transmission filter 74 is disposed on a path between the first PA 2 and the antenna switch 16. The first transmission filter 74 allows a first transmission signal to pass therethrough. The first transmission signal is amplified in power by the first PA 2 and is output from the first PA 2. The transmission path is a path connecting the input terminal 12 and the antenna terminal 11 to transmit an RF signal from the antenna 81.

The first reception filter 75 illustrated in FIG. 2 is a reception filter that allows a first reception signal to pass therethrough. The first reception filter 75 is disposed, on a reception path, between the antenna terminal 11 and the low-noise amplifier 76c. More specifically, the first reception filter 75 is disposed on a path between the antenna switch 16 and the low-noise amplifier 76c. The first reception filter 75 allows a first reception signal from the antenna 81 to pass therethrough. The reception path is a path connecting the antenna terminal 11 and the output terminal 13 to output an RF signal to the signal processing circuit 82.

As illustrated in FIG. 2, the duplexer 72 includes a second transmission filter 721 and a second reception filter 722.

The second transmission filter 721 is a transmission filter that allows a second transmission signal to pass therethrough. The second transmission filter 721 is disposed, on a transmission path, between a second PA 3a and the antenna terminal 11. More specifically, the second transmission filter 721 is disposed on a path between the second PA 3a and the antenna switch 16. The second transmission filter 721 allows a second transmission signal to pass therethrough. The second transmission signal is amplified in power by the second PA 3a and is output from the second PA 3a. The transmission path is a path connecting the input terminal 12 and the antenna terminal 11 to transmit an RF signal from the antenna 81.

The second reception filter 722 is a reception filter that allows a second reception signal to pass therethrough. The second reception filter 722 is disposed, on a reception path, between the antenna terminal 11 and the low-noise amplifier 76a. More specifically, the second reception filter 722 is disposed on a path between the antenna switch 16 and the low-noise amplifier 76a. The second reception filter 722 allows a second reception signal from the antenna 81 to pass therethrough. The reception path is a path connecting the antenna terminal 11 and the output terminal 13 to output an RF signal to the signal processing circuit 82.

As illustrated in FIG. 2, the duplexer 73 includes a second transmission filter 731 and a second reception filter 732.

The second transmission filter 731 is a transmission filter that allows a second transmission signal to pass therethrough. As shown, the second transmission filter 731 is disposed, on a transmission path, between a second PA 3b and the antenna terminal 11. More specifically, the second transmission filter 731 is disposed on a path between the second PA 3b and the antenna switch 16. The second transmission filter 731 allows a second transmission signal to pass therethrough. The second transmission signal is amplified in power by the second PA 3b and is output from the second PA 3b. The transmission path is a path connecting the input terminal 12 and the antenna terminal 11 to transmit an RF signal from the antenna 81.

The second reception filter 732 is a reception filter that allows a second reception signal to pass therethrough. The second reception filter 732 is disposed, on a reception path, between the antenna terminal 11 and the low-noise amplifier 76b. More specifically, the second reception filter 732 is disposed on a path between the antenna switch 16 and the low-noise amplifier 76b. The second reception filter 732 allows a second reception signal from the antenna 81 to pass therethrough. The reception path is a path connecting the antenna terminal 11 and the output terminal 13 to output an RF signal to the signal processing circuit 82.

(4.2) Low-Noise Amplifiers

The low-noise amplifier 76c illustrated in FIG. 2 is an amplifier that amplifies a first reception signal with low noise. The low-noise amplifier 76c is disposed, on a reception path, between the first reception filter 75 and the reception switch 17. The low-noise amplifier 76c has an input terminal and an output terminal. The input terminal of the low-noise amplifier 76c is connected to the first reception filter 75, and the output terminal of the low-noise amplifier 76c is connected to an external circuit (for example, the signal processing circuit 82) via the reception switch 17 and the output terminal 13.

The low-noise amplifier 76a illustrated in FIG. 2 is an amplifier that amplifies a second reception signal with low noise. The low-noise amplifier 76a is disposed, on a reception path, between the second reception filter 722 and the reception switch 17. Moreover, the low-noise amplifier 76a has an input terminal and an output terminal. The input terminal of the low-noise amplifier 76a is connected to the second reception filter 722, and the output terminal of the low-noise amplifier 76a is connected to an external circuit (for example, the signal processing circuit 82) via the reception switch 17 and the output terminal 13. The low-noise amplifier 76b is similar to the low-noise amplifier 76a.

(4.3) Transmission Switch

As illustrated in FIG. 2, the transmission switch 15 is a switch for switching the path to be connected to the input terminal 12. In other words, the transmission switch 15 is a switch for switching the PA to be connected to the input terminal 12 among the first PA 2 and the second PAs 3a and 3b.

The transmission switch 15 has a common terminal 151 and a plurality of (e.g., three in the illustrated example) selection terminals 152 to 154. The common terminal 151 is connected to the input terminal 12. The selection terminal 152 is connected to the first PA 2. The selection terminal 153 is connected to the second PA 3a. The selection terminal 154 is connected to the second PA 3b.

In an exemplary aspect, the transmission switch 15 is configured to connect at least one of the plurality of selection terminals 152 to 154 to the common terminal 151. The transmission switch 15 is, for example, a switch IC. The transmission switch 15 is, for example, controlled by the signal processing circuit 82, which will be described below. The transmission switch 15 switches the connection state between the common terminal 151 and the plurality of selection terminals 152 to 154 in response to a control signal from the RF signal processing circuit 84 of the signal processing circuit 82.

(4.4) Antenna Switch

As illustrated in FIG. 2, the antenna switch 16 is a switch configured to switch the path to be connected to the antenna terminal 11. In other words, the antenna switch 16 is a switch for switching the filter to be connected to the antenna terminal 11 among the duplexers 72 and 73, the first transmission filter 74, and the first reception filter 75.

The antenna switch 16 has a common terminal 161 and a plurality of (e.g., four in the illustrated example) selection terminals 162 to 165. The common terminal 161 is connected to the antenna terminal 11. The selection terminal 162 is connected to the first transmission filter 74. The selection terminal 163 is connected to the first reception filter 75. The selection terminal 164 is connected to the duplexer 72. The selection terminal 165 is connected to the duplexer 73.

The antenna switch 16 is, for example, a switch that connect at least one of the plurality of selection terminals 162 to 165 to the common terminal 161. The antenna switch 16 is, for example, a switch IC. The antenna switch 16 is, for example, controlled by the signal processing circuit 82, which will be described below. The antenna switch 16 switches the connection state between the common terminal 161 and the plurality of selection terminals 162 to 165 in response to a control signal from the RF signal processing circuit 84 of the signal processing circuit 82. The antenna switch 16 can be configured to simultaneously connect the plurality of selection terminals 162 to 165 to the common terminal 161. In this case, the antenna switch 16 is configured for a one-to-many connection.

(4.5) Reception Switch

As illustrated in FIG. 2, the reception switch 17 is a switch for switching the path to be connected to the output terminal 13. In other words, the reception switch 17 is a switch for switching the low-noise amplifier to be connected to the output terminal 13 among the low-noise amplifiers 76a to 76c.

The reception switch 17 has a common terminal 171 and a plurality of (e.g., three in the illustrated example) selection terminals 172 to 174. The common terminal 171 is connected to the output terminal 13. The selection terminal 172 is connected to the low-noise amplifier 76c. The selection terminal 173 is connected to the low-noise amplifier 76a. The selection terminal 174 is connected to the low-noise amplifier 76b.

In an exemplary aspect, the reception switch 17 is configured to connect at least one of the plurality of selection terminals 172 to 174 to the common terminal 171. The reception switch 17 is, for example, a switch IC. The reception switch 17 is, for example, controlled by the signal processing circuit 82, which will be described below. The reception switch 17 switches the connection state between the common terminal 171 and the plurality of selection terminals 172 to 174 in response to a control signal from the RF signal processing circuit 84 of the signal processing circuit 82.

(4.6) Antenna Terminal, Input Terminal, Output Terminal

As illustrated in FIG. 2, the antenna terminal 11 is a terminal connected to the antenna 81, which will be described below. The antenna terminal 11 is directly or indirectly connected to the antenna 81. An RF signal from the RF module 1 is output to the antenna 81 via the antenna terminal 11. An RF signal from the antenna 81 is output to the RF module 1 via the antenna terminal 11.

As illustrated in FIG. 2, the input terminal 12 is a terminal connected to the signal processing circuit 82, which will be described below. The input terminal 12 is directly or indirectly connected to the signal processing circuit 82. An RF signal from the signal processing circuit 82 is output to the first PA 2 or the second PA 3 via the input terminal 12 and the transmission switch 15.

As illustrated in FIG. 2, the output terminal 13 is a terminal connected to the signal processing circuit 82, which will be described below. The output terminal 13 is directly or indirectly connected to the signal processing circuit 82. RF signals from the low-noise amplifiers 76a to 76c are output to the signal processing circuit 82 via the reception switch 17 and the output terminal 13.

(5) Structure of RF Module

Hereinafter, the structure of the RF module 1 according to the first exemplary embodiment will be described with reference to the drawings.

Figure 4:
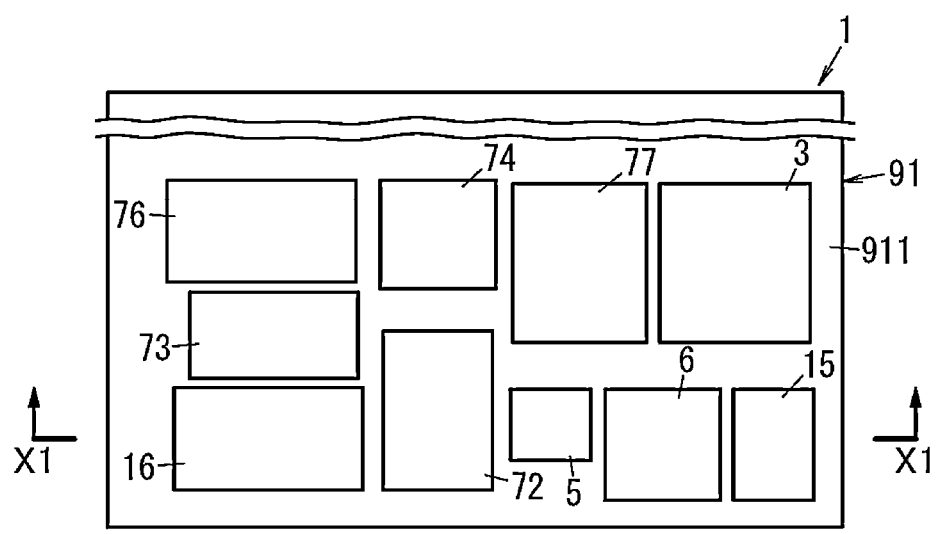
FIG. 4 is a front view of the RF module according to the first exemplary embodiment.
Figure 5:
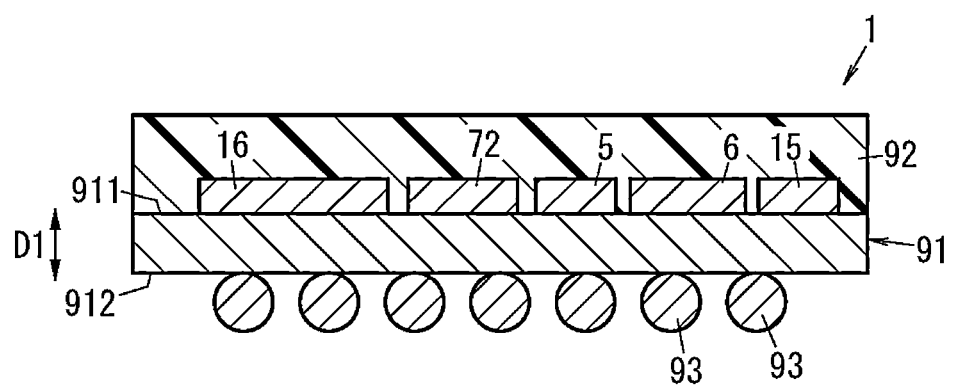
FIG. 5 is a sectional view of the RF module according to the first embodiment taken along the line X1-X1 in FIG. 4.

As illustrated in FIG. 4 and FIG. 5, the RF module 1 includes a mounting substrate 91, a plurality of external connection terminals 93, and a resin member 92.

The RF module 1 is electrically connectable to an external substrate (not illustrated). The external substrate corresponds to, for example, a mother substrate of the communication device 8 (see FIG. 2), such as a mobile phone or communication equipment. The RF module 1 being electrically connectable to an external substrate includes not only a case where the RF module 1 is directly mounted on the external substrate but also a case where the RF module 1 is indirectly mounted on the external substrate. The case where the RF module 1 is indirectly mounted on the external substrate is, for example, a case where the RF module 1 is mounted on another module mounted on the external substrate.

(5.1) Mounting Substrate

As illustrated in FIG. 5, the mounting substrate 91 has a first main surface 911 and a second main surface 912. The first main surface 911 and the second main surface 912 are opposed to each other in a thickness direction D1 of the mounting substrate 91. The second main surface 912 is opposed to an external substrate (not illustrated) when the RF module 1 is disposed on the external substrate. The mounting substrate 91 has electronic components mounted on the first main surface 911.

In an exemplary aspect, the mounting substrate 91 is a multilayer substrate including a plurality of dielectric layers laminated one on top of another. Although not illustrated, the mounting substrate 91 has a plurality of conductor pattern portions and a plurality of via-electrodes, including through-electrodes, for example. The plurality of conductor pattern portions include a conductor pattern portion having a ground potential. The plurality of via-electrodes are used for electrical connection between elements mounted on the first main surface 911 of the mounting substrate 91 and the conductor pattern portions of the mounting substrate 91. The plurality of via-electrodes are also used for electrical connection between elements mounted on the first main surface 911 of the mounting substrate 91 and elements mounted on the second main surface 912 of the mounting substrate 91, and electrical connection between the conductor pattern portions of the mounting substrate 91 and the external connection terminals 93.

As illustrated in FIG. 4, the second PA 3, the filter 5, and the switch 6 are disposed on the first main surface 911 of the mounting substrate 91. Furthermore, the duplexers 72 and 73, the first transmission filter 74, the low-noise amplifier 76, and a matching circuit 77 are disposed on the first main surface 911 of the mounting substrate 91. In addition, the transmission switch 15 and the antenna switch 16 are disposed on the first main surface 911 of the mounting substrate 91. On the other hand, on the second main surface 912 of the mounting substrate 91, the plurality of external connection terminals 93 are disposed as illustrated in FIG. 5.

(5.2) Second PA

As illustrated in FIG. 4, the second PA 3 is disposed on the first main surface 911 of the mounting substrate 91. A part of the second PA 3 may be disposed in the mounting substrate 91. In other words, the second PA 3 may be disposed, on or in the mounting substrate 91, closer to the first main surface 911 than to the second main surface 912.

(5.3) Duplexers

The duplexer 72 illustrated in FIG. 4 includes the second transmission filter 721 (see FIG. 2) and the second reception filter 722 (see FIG. 2), as described above. Similarly, the duplexer 73 includes the second transmission filter 731 (see FIG. 2) and the second reception filter 732 (see FIG. 2), as described above. Hereinafter, the duplexer 72 (i.e., the second transmission filter 721 and the second reception filter 722) will be described, and the same applies to the duplexer 73 (i.e., the second transmission filter 731 and the second reception filter 732).

The second transmission filter 721 illustrated in FIG. 2 is, for example, an acoustic wave filter including a plurality of series-arm resonators and a plurality of parallel-arm resonators. The acoustic wave filter is, for example, a surface acoustic wave (SAW) filter using a surface acoustic wave. Furthermore, the second transmission filter 721 may include at least one of an inductor and a capacitor connected in series to any one of the plurality of series-arm resonators, or may include an inductor or a capacitor connected in series to any one of the plurality of parallel-arm resonators.

Similarly, the second reception filter 722 illustrated in FIG. 2 is, for example, an acoustic wave filter including a plurality of series-arm resonators and a plurality of parallel-arm resonators. The acoustic wave filter is, for example, a SAW filter using a surface acoustic wave. Furthermore, the second reception filter 722 may include at least one of an inductor and a capacitor connected in series to any one of the plurality of series-arm resonators, or may include an inductor or a capacitor connected in series to any one of the plurality of parallel-arm resonators.

As illustrated in FIG. 4, the duplexer 72 is disposed on the first main surface 911 of the mounting substrate 91. A part of the duplexer 72 may be disposed in the mounting substrate 91. In other words, the duplexer 72 may be disposed, on or in the mounting substrate 91, closer to the first main surface 911 than to the second main surface 912.

(5.4) External Connection Terminals

As illustrated in FIG. 5, the plurality of external connection terminals 93 are terminals for electrically connecting the mounting substrate 91 to an external substrate (not illustrated). The plurality of external connection terminals 93 include the antenna terminal 11, the input terminal 12, the output terminal 13, and the external connection terminal 4 illustrated in FIG. 2, and a plurality of ground terminals (not illustrated).

The plurality of external connection terminals 93 are disposed on the second main surface 912 of the mounting substrate 91. Each external connection terminal 93 is, for example, a spherical electrode disposed on the second main surface 912 of the mounting substrate 91. Each external connection terminal 93 is, for example, a solder bump. The material of the plurality of external connection terminals 93 is, for example, metal, such as solder or the like.

The RF module 1 includes the plurality of external connection terminals 93 from the viewpoint of increasing the mountability of the RF module 1 onto an external substrate (mother substrate), increasing the number of ground terminals of the RF module 1, and so forth.

(5.5) Resin Member

As illustrated in FIG. 5, the resin member 92 is disposed on the first main surface 911 of the mounting substrate 91, and covers the electronic components disposed on the first main surface 911 of the mounting substrate 91 and the first main surface 911 of the mounting substrate 91. The resin member 92 is configured to ensure reliability, such as mechanical strength and moisture resistance, of the electronic components disposed on the first main surface 911 of the mounting substrate 91.

(6) Detailed Structures of Individual Components of RF Module (6.1) Mounting Substrate The mounting substrate 91 illustrated in FIG. 5 is, for example, a printed wiring board or a low temperature co-fired ceramics (LTCC) substrate. The mounting substrate 91 is, for example, a multilayer substrate including a plurality of dielectric layers and a plurality of conductor pattern portions. The plurality of dielectric layers and the plurality of conductor pattern portions are laminated in the thickness direction D1 of the mounting substrate 91. The plurality of conductor pattern portions are each formed in a predetermined pattern. The plurality of conductor pattern portions each include one or more conductor portions in one plane orthogonal to the thickness direction D1 of the mounting substrate 91. The material of each conductor pattern portion is, for example, copper.

The first main surface 911 and the second main surface 912 of the mounting substrate 91 are separated from each other in the thickness direction D1 of the mounting substrate 91, and intersect the thickness direction D1 of the mounting substrate 91. The first main surface 911 of the mounting substrate 91 is orthogonal to the thickness direction D1 of the mounting substrate 91, but may include, for example, a side surface of a conductor portion as a surface that is not orthogonal to the thickness direction D1. The second main surface 912 of the mounting substrate 91 is orthogonal to the thickness direction D1 of the mounting substrate 91, but may include, for example, a side surface of a conductor portion as a surface that is not orthogonal to the thickness direction D1. The first main surface 911 and the second main surface 912 of the mounting substrate 91 may have fine irregularities, recessed portions, or protruding portions.

(6.2) Filters

The detailed structures of the duplexers 72 and 73, the first transmission filter 74, and the first reception filter 75 illustrated in FIG. 2 will be described. In the following description, the duplexers 72 and 73, the first transmission filter 74, and the first reception filter 75 will be referred to as filters without being distinguished from each other.

Each filter is a one-chip filter. In the filter, for example, each of a plurality of series-arm resonators and a plurality of parallel-arm resonators is constituted by an acoustic wave resonator. In this case, the filter includes, for example, a substrate, a piezoelectric layer, and a plurality of interdigital transducer (IDT) electrodes. The substrate has a first surface and a second surface. The piezoelectric layer is disposed on the first surface of the substrate. The piezoelectric layer is disposed on a low-acoustic-velocity film. The plurality of IDT electrodes are disposed on the piezoelectric layer. The low-acoustic-velocity film is disposed directly or indirectly on the substrate. The piezoelectric layer is disposed directly or indirectly on the low-acoustic-velocity film. In the low-acoustic-velocity film, the acoustic velocity of a bulk wave propagating therethrough is lower than the acoustic velocity of an acoustic wave propagating through the piezoelectric layer. In the substrate, the acoustic velocity of a bulk wave propagating therethrough is higher than the acoustic velocity of an acoustic wave propagating through the piezoelectric layer. The material of the piezoelectric layer is, for example, lithium tantalate. According to an exemplary aspect, the material of the low-acoustic-velocity film is, for example, silicon oxide. Moreover, the substrate is, for example, a silicon substrate. The piezoelectric layer has a thicknesses of, for example, $3.5\lambda$ or less, where $\lambda$ represents the wavelength of an acoustic wave determined by the electrode-finger period of the IDT electrodes. The low-acoustic-velocity film has a thickness of, for example, $2.0\lambda$ or less.

The piezoelectric layer may be formed of, for example, lithium tantalate, lithium niobate, zinc oxide, aluminum nitride, or lead zirconate titanate. The low-acoustic-velocity film may contain at least one material selected from the group consisting of silicon oxide, glass, silicon oxynitride, tantalum oxide, and a compound obtained by adding fluorine, carbon, or boron to silicon oxide. The substrate may contain at least one material selected from the group consisting of silicon, aluminum nitride, aluminum oxide, silicon carbide, silicon nitride, sapphire, lithium tantalate, lithium niobate, quartz, alumina, zirconia, cordierite, mullite, steatite, forsterite, magnesia, and diamond.

The filter further includes, for example, a spacer layer and a cover member. The spacer layer and the cover member are disposed on the first surface of the substrate. Moreover, the spacer layer surrounds the plurality of IDT electrodes in plan view in the thickness direction of the substrate. The spacer layer has a frame shape (e.g., a rectangular frame shape) in plan view in the thickness direction of the substrate. The spacer layer is electrically insulating. The material of the spacer layer is, for example, a synthetic resin such as epoxy resin or polyimide. The cover member is flat-shaped. In plan view in the thickness direction of the substrate, the cover member has a rectangular shape, but the shape is not limited thereto. For example, the cover member may have a square shape. In the filter, the outer size of the cover member and the outer size of the spacer layer are substantially the same in plan view in the thickness direction of the substrate. The cover member is disposed on the spacer layer so as to be opposed to the substrate in the thickness direction of the substrate. The cover member overlaps the plurality of IDT electrodes in the thickness direction of the substrate, and is separated from the plurality of IDT electrodes in the thickness direction of the substrate. The cover member is electrically insulating. The material of the cover member is, for example, a synthetic resin such as epoxy resin or polyimide. The filter has a space surrounded by the substrate, the spacer layer, and the cover member. The space of the filter is filled with a gas. The gas is, for example, air, an inert gas (for example, nitrogen gas), or the like. A plurality of terminals are exposed from the cover member. Each of the plurality of terminals is, for example, a bump. The bump is, for example, a solder bump, but it is noted that the bump is not limited to a solder bump and can be, for example, a gold bump in another exemplary aspect.

The filter may include, for example, an adhesion layer interposed between the low-acoustic-velocity film and the piezoelectric layer. The adhesion layer is made of, for example, a resin (e.g., an epoxy resin or polyimide resin). The filter may include a dielectric film between the low-acoustic-velocity film and the piezoelectric layer, on the piezoelectric layer, or under the low-acoustic-velocity film.

The filter may include, for example, a high-acoustic-velocity film interposed between the substrate and the low-acoustic-velocity film. The high-acoustic-velocity film is disposed directly or indirectly on the substrate. The low-acoustic-velocity film is disposed directly or indirectly on the high-acoustic-velocity film. The piezoelectric layer is disposed directly or indirectly on the low-acoustic-velocity film. In the high-acoustic-velocity film, the acoustic velocity of a bulk wave propagating therethrough is higher than the acoustic velocity of an acoustic wave propagating through the piezoelectric layer. In the low-acoustic-velocity film, the acoustic velocity of a bulk wave propagating therethrough is lower than the acoustic velocity of an acoustic wave propagating through the piezoelectric layer.

According to an exemplary aspect, the high-acoustic-velocity film is made of a piezoelectric material such as diamond-like carbon, aluminum nitride, aluminum oxide, silicon carbide, silicon nitride, silicon, sapphire, lithium tantalate, lithium niobate, or quartz; a ceramic such as alumina, zirconia, cordierite, mullite, steatite, or forsterite; magnesia; diamond; a material mainly composed of one of the above materials; or a material mainly composed of a mixture of the above materials.

The high-acoustic-velocity film desirably has a largest possible thickness because the high-acoustic-velocity film has a function of confining an acoustic wave in the piezoelectric layer and the low-acoustic-velocity film. The piezoelectric substrate may include an adhesion layer, a dielectric film, or the like, in addition to the high-acoustic-velocity film, the low-acoustic-velocity film, and the piezoelectric layer.

Each of the plurality of series-arm resonators and the plurality of parallel-arm resonators is not limited to the above-described acoustic wave resonator and may be, for example, a SAW resonator or a bulk acoustic wave (BAW) resonator. The SAW resonator includes, for example, a piezoelectric substrate and an IDT electrode disposed on the piezoelectric substrate. In a case where each of the plurality of series-arm resonators and the plurality of parallel-arm resonators is constituted by a SAW resonator, the filter includes, on a single piezoelectric substrate, a plurality of IDT electrodes corresponding one-to-one to the plurality of series-arm resonators and a plurality of IDT electrodes corresponding one-to-one to the plurality of parallel-arm resonators. The piezoelectric substrate is, for example, a lithium tantalate substrate, a lithium niobate substrate, or the like.

(6.3) PAs

The detailed structures of the first PA 2 and the second PA 3 illustrated in FIG. 2 will be described. In the following description, the first PA 2 and the second PA 3 will be referred to as PAs without being distinguished from each other.

In an exemplary aspect, each PA can be, for example, a one-chip IC including a substrate and an amplification function unit. The substrate has a first surface and a second surface opposed to each other. The substrate is, for example, a gallium arsenide substrate. The amplification function unit includes at least one transistor formed on the first surface of the substrate. The amplification function unit is a function unit having a function of amplifying a transmission signal of a predetermined frequency band. The transistor is, for example, a heterojunction bipolar transistor (HBT). In the PA, the power supply voltage V1 from the tracker component 85 is applied between the collector and emitter of the HBT. The PA may include, for example, a capacitor for cutting direct current (DC) in addition to the amplification function unit. The PA is flip-chip mounted on the first main surface 911 of the mounting substrate 91 such that the first surface of the substrate is on the first main surface 911 of the mounting substrate 91. The PA has an outer periphery that is quadrangular in plan view in the thickness direction D1 of the mounting substrate 91.

(6.4) Low-Noise Amplifiers

The detailed structures of the low-noise amplifiers 76*a* to 76*c* illustrated in FIG. 2 will be described. In the following description, the low-noise amplifiers 76*a* to 76*c* are referred to as low-noise amplifiers without being distinguished from each other.

Each low-noise amplifier is, for example, one IC chip including a substrate and an amplification function unit. Moreover, the substrate has a first surface and a second surface opposed to each other. The substrate is, for example, a silicon substrate. The amplification function unit is formed on the first surface of the substrate. The amplification function unit is a function unit having a function of amplifying a reception signal of a predetermined frequency band. The low-noise amplifier is flip-chip mounted on the second main surface 912 of the mounting substrate 91 such that the first surface of the substrate is on the second main surface 912 of the mounting substrate 91. The low-noise amplifier has an outer periphery that is quadrangular in plan view in the thickness direction D1 of the mounting substrate 91.

(7) Individual Components of Communication Device

Hereinafter, the individual components of the communication device 8 according to the first exemplary embodiment will be described with reference to FIG. 2. As described above, the communication device 8 includes the RF module 1, the antenna 81, the signal processing circuit 82, and the tracker component 85.

(7.1) Antenna

As illustrated in FIG. 2, the antenna 81 is connected to the antenna terminal 11 of the RF module 1. The antenna 81 has a transmission function of radiating an RF signal (e.g., a transmission signal) output from the RF module 1 as a radio wave, and a reception function of receiving an RF signal (e.g., a reception signal) as a radio wave from the outside and outputting the received RF signal to the RF module 1.

(7.2) Signal Processing Circuit

As illustrated in FIG. 2, the signal processing circuit 82 includes a baseband signal processing circuit 83 and the RF signal processing circuit 84. The signal processing circuit 82 processes a first transmission signal, a first reception signal, a second transmission signal, and a second reception signal.

The baseband signal processing circuit 83 is, for example, a baseband integrated circuit (BBIC), and performs signal processing on an RF signal. The RF signal has a frequency of around several hundred MHz to several GHz, for example.

The baseband signal processing circuit 83 generates an I-phase signal and a Q-phase signal from a baseband signal. The baseband signal is, for example, an audio signal, an image signal, or the like received from the outside. The baseband signal processing circuit 83 combines the I-phase signal and the Q-phase signal to perform IQ modulation processing, and outputs a transmission signal. At this time, the transmission signal is generated as a modulated signal (e.g., an IQ signal), which is obtained through amplitude modulation performed on a carrier signal of a predetermined frequency in a period longer than the period of the carrier signal. The modulated signal is output as an IQ signal from the baseband signal processing circuit 83. The IQ signal is a signal whose amplitude and phase are represented on an IQ plane. The IQ signal has a frequency of around several MHz to several tens of MHz, for example.

The RF signal processing circuit 84 is, for example, a radio frequency integrated circuit (RFIC), and performs signal processing on an RF signal. For example, the RF signal processing circuit 84 performs predetermined signal processing on the modulated signal (e.g., an IQ signal) output from the baseband signal processing circuit 83. More specifically, the RF signal processing circuit 84 performs signal processing such as up-conversion on the modulated signal output from the baseband signal processing circuit 83, and outputs the RF signal generated through the signal processing to the RF module 1. The signal processing performed by the RF signal processing circuit 84 is not limited to direct conversion from the modulated signal into the RF signal. The RF signal processing circuit 84 may convert the modulated signal into an intermediate frequency (IF) signal, and generate an RF signal from the IF signal obtained through the conversion.

The signal processing circuit 82 outputs a power supply control signal to the tracker component 85. The power supply control signal is a signal including information regarding amplitude variations of an RF signal, and is output from the signal processing circuit 82 to the tracker component 85 in order to change the amplitude of the power supply voltage V1. The power supply control signal includes, for example, an I-phase signal and a Q-phase signal.

(7.3) Tracker Component

As illustrated in FIG. 2, the tracker component 85 is configured to supply the power supply voltage V1 to the first PA 2 and the second PA 3. More specifically, the tracker component 85 generates the power supply voltage V1 having a level corresponding to an envelope extracted from a modulated signal of an RF signal, and supplies the power supply voltage V1 to the RF module 1.

The tracker component 85 includes an input terminal (not illustrated) that receives a power supply control signal, and a voltage generator (not illustrated) that generates the power supply voltage V1. The input terminal is connected to the signal processing circuit 82 and receives a power supply control signal from the signal processing circuit 82. The tracker component 85 generates the power supply voltage V1 in response to the power supply control signal received by the input terminal. At this time, the tracker component 85 changes the amplitude of the power supply voltage V1 in response to the power supply control signal from the signal processing circuit 82. In other words, the tracker component 85 is an envelope tracking circuit that generates the power supply voltage V1 that varies in accordance with the envelope of the amplitude of an RF signal output from the signal processing circuit 82. The tracker component 85 includes, for example, a DC-DC converter, detects the amplitude level of the RF signal from an I-phase signal and a Q-phase signal, and generates the power supply voltage V1 by using the detected amplitude level.

Accordingly, the tracker component 85 supplies the power supply voltage V1 to the RF module 1 via the external connection terminal 4 by using the ET method.

(8) Details of Tracker Component

Next, the tracker component 85 according to the first embodiment will be described in detail with reference to FIG. 6 and FIG. 7.

Figure 6:
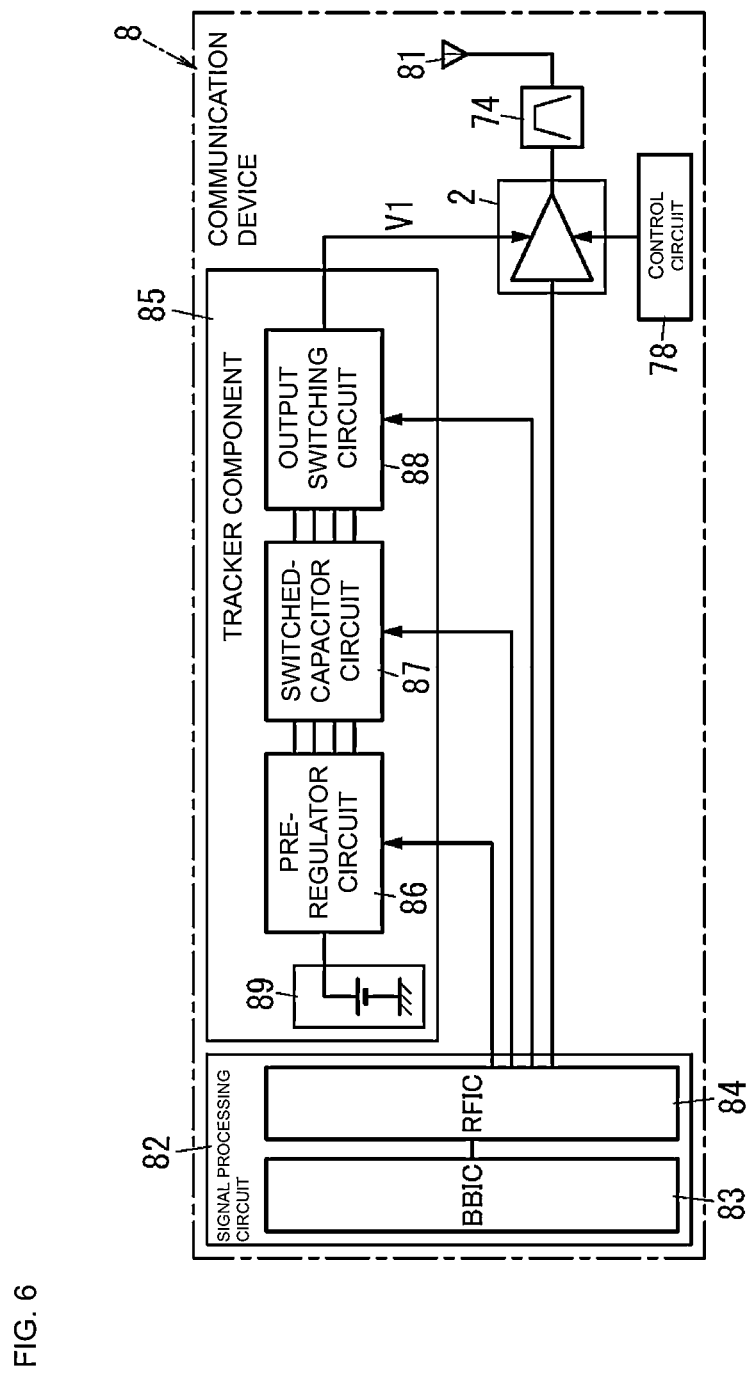
FIG. 6 is a conceptual diagram illustrating the configuration of the communication device according to the first exemplary embodiment.
Figure 7:
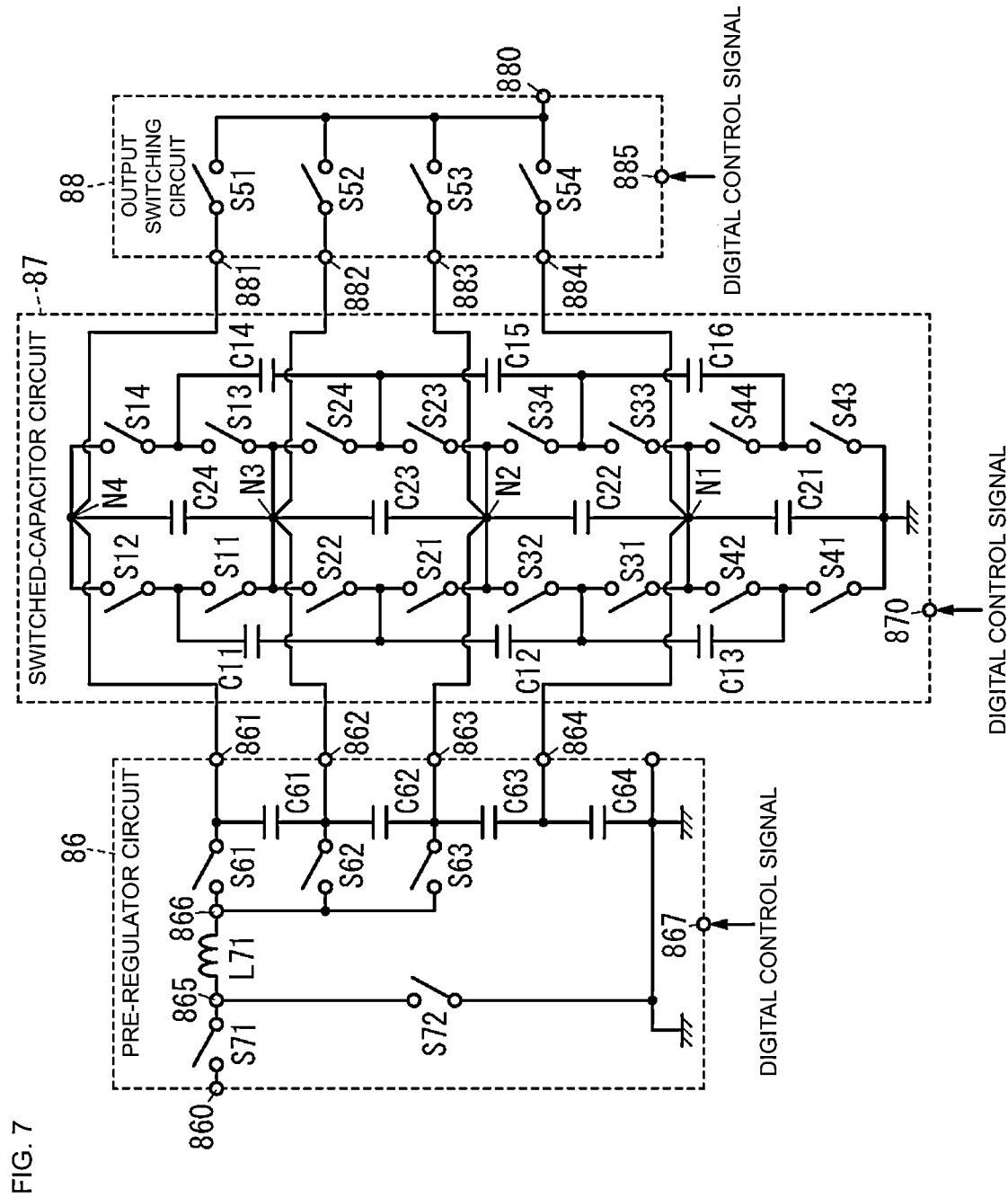
FIG. 7 is a conceptual diagram illustrating the configuration of a tracker component according to the first exemplary embodiment.

As illustrated in FIG. 6 and FIG. 7, the tracker component 85 includes a pre-regulator circuit 86, a switched-capacitor circuit 87, an output switching circuit 88, and a DC power supply 89.

The tracker component 85 supplies the PA 2 with the power supply voltage V1 having a power supply voltage level selected from among a plurality of discrete voltage levels in response to an envelope signal.

The pre-regulator circuit 86 includes a power inductor and switches. The power inductor is an inductor used to raise and/or lower (e.g., raise, lower, or raise and lower) a DC voltage. The power inductor is disposed in series in a DC path. The pre-regulator circuit 86 converts a voltage by using the power inductor. The pre-regulator circuit 86 may also be referred to as a magnetic regulator or a DC-DC converter. Alternatively, the power inductor may be connected between a series-arm path and the ground, that is, it may be disposed in parallel.

The pre-regulator circuit 86 does not necessarily need to include the power inductor, and may be, for example, a circuit or the like that raises and/or lowers (e.g., raises, lowers, or raises and lowers) a voltage by switching between capacitors disposed in the series-arm path and a parallel-arm path of the pre-regulator circuit 86.

The switched-capacitor circuit 87 includes a plurality of capacitors and a plurality of switches, and is configured to generate a plurality of voltages respectively having a plurality of discrete voltage levels from the voltage output from the pre-regulator circuit 86. The switched-capacitor circuit 87 may also be referred to as a switched-capacitor voltage balancer.

The output switching circuit 88 selects, in response to a digital control signal corresponding to the envelope signal, at least one of the plurality of voltages generated by the switched-capacitor circuit 87, and outputs the selected voltage to the PA 2.

The DC power supply 89 supplies a DC voltage to the pre-regulator circuit 86. The DC power supply 89 may be, and is not limited to, a rechargeable battery, for example.

The tracker component 85 does not necessarily need to include at least one of the pre-regulator circuit 86 and the DC power supply 89. For example, the tracker component 85 does not necessarily need to include the DC power supply 89. Any combination of the pre-regulator circuit 86, the switched-capacitor circuit 87, and the output switching circuit 88 may be integrated into a single circuit. A detailed circuit configuration example of the tracker component 85 will be described below with reference to FIG. 7.

(8.1) Circuit Configuration of Tracker Component

Next, the circuit configurations of the pre-regulator circuit 86, the switched-capacitor circuit 87, and the output switching circuit 88 included in the tracker component 85 will be described with reference to FIG. 7.

FIG. 7 illustrates an exemplary circuit configuration. The pre-regulator circuit 86, the switched-capacitor circuit 87, and the output switching circuit 88 may be mounted by using any one of a wide variety of circuit packaging methods and circuit techniques. Thus, the description of the individual circuits provided below should not be construed in a limiting manner.

(8.2) Switched-Capacitor Circuit

As illustrated in FIG. 7, the switched-capacitor circuit 87 includes a plurality of (e.g., six in the illustrated example) capacitors C11 to C16, a plurality of (e.g., four in the illustrated example) capacitors C21 to C24, a plurality of (e.g., sixteen in the illustrated example) switches S11 to S14, S21 to S24, S31 to S34, and S41 to S44, and a control terminal 870.

The control terminal 870 is an input terminal for a digital control signal. More specifically, the control terminal 870 is a terminal for receiving a digital control signal for controlling the switched-capacitor circuit 87. The digital control signal received via the control terminal 870 is, for example, a control signal of a source synchronous scheme in which a data signal and a clock signal are transmitted. The digital control signal is not limited to the control signal of the source synchronous scheme. For example, the digital control signal may be a control signal of a clock embedded scheme.

The plurality of capacitors C11 to C16 each function as a flying capacitor (e.g., a transfer capacitor). That is, the plurality of capacitors C11 to C16 are each used to raise or lower the voltage supplied from the pre-regulator circuit 86. More specifically, the plurality of capacitors C11 to C16 are configured to cause electric charges to move between the capacitors C11 to C16 and nodes N1 to N4 so that voltages V41 to V44 (e.g., voltages with respect to the ground potential) satisfying V41:V42:V43:V44=1:2:3:4 are maintained at the four nodes N1 to N4. The plurality of voltages V41 to V44 correspond to a plurality of voltages respectively having a plurality of discrete voltage levels. The voltage V41 is the voltage at the node N1, the voltage V42 is the voltage at the node N2, the voltage V43 is the voltage at the node N3, and the voltage V44 is the voltage at the node N4.

The capacitor C11 has two electrodes (e.g., a first electrode and a second electrode). One of the two electrodes (first electrode) of the capacitor C11 is connected to one terminal (first terminal) of the switch S11 and one terminal (first terminal) of the switch S12. The other of the two electrodes (second electrode) of the capacitor C11 is connected to one terminal (first terminal) of the switch S21 and one terminal (first terminal) of the switch S22.

The capacitor C12 has two electrodes (e.g., a first electrode and a second electrode). One of the two electrodes (first electrode) of the capacitor C12 is connected to the one terminal (first terminal) of the switch S21 and the one terminal (first terminal) of the switch S22. The other of the two electrodes (second electrode) of the capacitor C12 is connected to one terminal (first terminal) of the switch S31 and one terminal (first terminal) of the switch S32.

The capacitor C13 has two electrodes (e.g., a first electrode and a second electrode). One of the two electrodes (first electrode) of the capacitor C13 is connected to the one terminal (first terminal) of the switch S31 and the one terminal (first terminal) of the switch S32. The other of the two electrodes (second electrode) of the capacitor C13 is connected to one terminal (first terminal) of the switch S41 and one terminal (first terminal) of the switch S42.

The capacitor C14 has two electrodes (e.g., a first electrode and a second electrode). One of the two electrodes (first electrode) of the capacitor C14 is connected to one terminal (first terminal) of the switch S13 and one terminal (first terminal) of the switch S14. The other of the two electrodes (second electrode) of the capacitor C14 is connected to one terminal (first terminal) of the switch S23 and one terminal (first terminal) of the switch S24.

The capacitor C15 has two electrodes (e.g., a first electrode and a second electrode). One of the two electrodes (first electrode) of the capacitor C15 is connected to the one terminal (first terminal) of the switch S23 and the one terminal (first terminal) of the switch S24. The other of the two electrodes (second electrode) of the capacitor C15 is connected to one terminal (first terminal) of the switch S33 and one terminal (first terminal) of the switch S34.

The capacitor C16 has two electrodes (e.g., a first electrode and a second electrode). One of the two electrodes (first electrode) of the capacitor C16 is connected to the one terminal (first terminal) of the switch S33 and the one terminal (first terminal) of the switch S34. The other of the two electrodes (second electrode) of the capacitor C16 is connected to one terminal (first terminal) of the switch S43 and one terminal (first terminal) of the switch S44.

In operation, a set of the capacitors C11 and C14, a set of the capacitors C12 and C15, and a set of the capacitors C13 and C16 can each be charged and discharged in a complementary manner as a result of the following first phase and second phase being repeated.

Specifically, in the first phase, the switches S12, S13, S22, S23, S32, S33, S42, and S43 are turned ON. Accordingly, for example, the one of the two electrodes (first electrode) of the capacitor C12 is connected to the node N3, the other of the two electrodes (second electrode) of the capacitor C12 and the one of the two electrodes (first electrode) of the capacitor C15 are connected to the node N2, and the other of the two electrodes (second electrode) of the capacitor C15 is connected to the node N1.

On the other hand, in the second phase, the switches S11, S14, S21, S24, S31, S34, S41, and S44 are turned ON. Accordingly, for example, the one of the two electrodes (first electrode) of the capacitor C15 is connected to the node N3, the other of the two electrodes (second electrode) of the capacitor C15 and the one of the two electrodes (first electrode) of the capacitor C12 are connected to the node N2, and the other of the two electrodes (second electrode) of the capacitor C12 is connected to the node N1.

As a result of the first phase and the second phase being repeated, for example, when one of the capacitors C12 and C15 is charged through the node N2, the other of the capacitors C12 and C15 can be discharged to the capacitor C23. In short, the capacitors C12 and C15 can be charged and discharged in a complementary manner. The capacitors C12 and C15 serve as a pair of flying capacitors that are charged and discharged in a complementary manner.

Similarly to the set of the capacitors C12 and C15, a set of any one of the capacitors C11 to C13 and any one of the capacitors C14 to C16 also serves as a pair of flying capacitors that are charged through a node and discharged to a smoothing capacitor in a complementary manner as a result of appropriate switching.

The plurality of capacitors C21 to C24 each function as a smoothing capacitor. Specifically, the capacitors C21 to C24 are used to hold and smooth the voltages V41 to V44 at the nodes N1 to N4.

The capacitor C21 is connected between the node N1 and the ground. Specifically, one of the two electrodes (first electrode) of the capacitor C21 is connected to the node N1. On the other hand, the other of the two electrodes (second electrode) of the capacitor C21 is connected to the ground.

The capacitor C22 is connected between the node N2 and the node N1. Specifically, one of the two electrodes (first electrode) of the capacitor C22 is connected to the node N2. On the other hand, the other of the two electrodes (second electrode) of the capacitor C22 is connected to the node N1.

The capacitor C23 is connected between the node N3 and the node N2. Specifically, one of the two electrodes (first electrode) of the capacitor C23 is connected to the node N3. On the other hand, the other of the two electrodes (second electrode) of the capacitor C23 is connected to the node N2.

The capacitor C24 is connected between the node N4 and the node N3. Specifically, one of the two electrodes (first electrode) of the capacitor C24 is connected to the node N4. On the other hand, the other of the two electrodes (second electrode) of the capacitor C24 is connected to the node N3.

The switch S11 is connected between the one of the two electrodes (first electrode) of the capacitor C11 and the node N3. Specifically, the one terminal (first terminal) of the switch S11 is connected to the one of the two electrodes of the capacitor C11. On the other hand, the other terminal (second terminal) of the switch S11 is connected to the node N3.

The switch S12 is connected between the one of the two electrodes (first electrode) of the capacitor C11 and the node N4. Specifically, the one terminal (first terminal) of the switch S12 is connected to the one of the two electrodes of the capacitor C11. On the other hand, the other terminal (second terminal) of the switch S12 is connected to the node N4.

The switch S21 is connected between the one of the two electrodes (first electrode) of the capacitor C12 and the node N2. Specifically, the one terminal (first terminal) of the switch S21 is connected to the one of the two electrodes of the capacitor C12 and the other of the two electrodes (second electrode) of the capacitor C11. On the other hand, the other terminal (second terminal) of the switch S21 is connected to the node N2.

The switch S22 is connected between the one of the two electrodes (first electrode) of the capacitor C12 and the node N3. Specifically, the one terminal (first terminal) of the switch S22 is connected to the one of the two electrodes of the capacitor C12 and the other of the two electrodes (second electrode) of the capacitor C11. On the other hand, the other terminal (second terminal) of the switch S22 is connected to the node N3.

The switch S31 is connected between the other of the two electrodes (second electrode) of the capacitor C12 and the node N1. Specifically, the one terminal (first terminal) of the switch S31 is connected to the other of the two electrodes of the capacitor C12 and the one of the two electrodes (first electrode) of the capacitor C13. On the other hand, the other terminal (second terminal) of the switch S31 is connected to the node N1.

The switch S32 is connected between the other of the two electrodes (second electrode) of the capacitor C12 and the node N2. Specifically, the one terminal (first terminal) of the switch S32 is connected to the other of the two electrodes of the capacitor C12 and the one of the two electrodes (first electrode) of the capacitor C13. On the other hand, the other terminal (second terminal) of the switch S32 is connected to the node N2. That is, the other terminal of the switch S32 is connected to the other terminal (second terminal) of the switch S21.

The switch S41 is connected between the other of the two electrodes (second electrode) of the capacitor C13 and the ground. Specifically, the one terminal (first terminal) of the switch S41 is connected to the other of the two electrodes (second electrode) of the capacitor C13. On the other hand, the other terminal (second terminal) of the switch S41 is connected to the ground.

The switch S42 is connected between the other of the two electrodes (second electrode) of the capacitor C13 and the node N1. Specifically, the one terminal (first terminal) of the switch S42 is connected to the other of the two electrodes (second electrode) of the capacitor C13. On the other hand, the other terminal (second terminal) of the switch S42 is connected to the node N1. That is, the other terminal of the switch S42 is connected to the other terminal (second terminal) of the switch S31.

The switch S13 is connected between the one of the two electrodes (first electrode) of the capacitor C14 and the node N3. Specifically, the one terminal (first terminal) of the switch S13 is connected to the one of the two electrodes (first electrode) of the capacitor C14. On the other hand, the other terminal (second terminal) of the switch S13 is connected to the node N3. That is, the other terminal of the switch S13 is connected to the other terminal (second terminal) of the switch S11 and the other terminal (second terminal) of the switch S22.

The switch S14 is connected between the one of the two electrodes (first electrode) of the capacitor C14 and the node N4. Specifically, the one terminal (first terminal) of the switch S14 is connected to the one of the two electrodes (first electrode) of the capacitor C14. On the other hand, the other terminal (second terminal) of the switch S14 is connected to the node N4. That is, the other terminal of the switch S14 is connected to the other terminal (second terminal) of the switch S12.

The switch S23 is connected between the one of the two electrodes (first electrode) of the capacitor C15 and the node N2. Specifically, the one terminal (first terminal) of the switch S23 is connected to the one of the two electrodes (first electrode) of the capacitor C15 and the other of the two electrodes (second electrode) of the capacitor C14. On the other hand, the other terminal (second terminal) of the switch S23 is connected to the node N2. That is, the other terminal of the switch S23 is connected to the other terminal (second terminal) of the switch S21 and the other terminal (second terminal) of the switch S32.

The switch S24 is connected between the one of the two electrodes (first electrode) of the capacitor C15 and the node N3. Specifically, the one terminal (first terminal) of the switch S24 is connected to the one of the two electrodes (first electrode) of the capacitor C15 and the other of the two electrodes (second electrode) of the capacitor C14. On the other hand, the other terminal (second terminal) of the switch S24 is connected to the node N3. That is, the other terminal of the switch S24 is connected to the other terminal (second terminal) of the switch S11, the other terminal (second terminal) of the switch S22, and the other terminal (second terminal) of the switch S13.

The switch S33 is connected between the other of the two electrodes (second electrode) of the capacitor C15 and the node N1. Specifically, the one terminal (first terminal) of the switch S33 is connected to the other of the two electrodes (second electrode) of the capacitor C15 and the one of the two electrodes (first electrode) of the capacitor C16. On the other hand, the other terminal (second terminal) of the switch S33 is connected to the node N1. That is, the other terminal of the switch S33 is connected to the other terminal (second terminal) of the switch S31 and the other terminal (second terminal) of the switch S42.

The switch S34 is connected between the other of the two electrodes (second electrode) of the capacitor C15 and the node N2. Specifically, the one terminal (first terminal) of the switch S34 is connected to the other of the two electrodes (second electrode) of the capacitor C15 and the one of the two electrodes (first electrode) of the capacitor C16. On the other hand, the other terminal (second terminal) of the switch S34 is connected to the node N2. That is, the other terminal of the switch S34 is connected to the other terminal (second terminal) of the switch S21, the other terminal (second terminal) of the switch S32, and the other terminal (second terminal) of the switch S23.

The switch S43 is connected between the other of the two electrodes (second electrode) of the capacitor C16 and the ground. Specifically, the one terminal (first terminal) of the switch S43 is connected to the other of the two electrodes (second electrode) of the capacitor C16. On the other hand, the other terminal (second terminal) of the switch S43 is connected to the ground.

The switch S44 is connected between the other of the two electrodes (second electrode) of the capacitor C16 and the node N1. Specifically, the one terminal (first terminal) of the switch S44 is connected to the other of the two electrodes (second electrode) of the capacitor C16. On the other hand, the other terminal (second terminal) of the switch S44 is connected to the node N1. That is, the other terminal of the switch S44 is connected to the other terminal (second terminal) of the switch S31, the other terminal (second terminal) of the switch S42, and the other terminal (second terminal) of the switch S33.

A first set of switches including the switches S12, S13, S22, S23, S32, S33, S42, and S43, and a second set of switches including the switches S11, S14, S21, S24, S31, S34, S41, and S44 are turned ON and OFF in a complementary manner. Specifically, in the first phase, the switches in the first set are turned ON whereas the switches in the second set are turned OFF. Conversely, in the second phase, the switches in the first set are turned OFF whereas the switches in the second set are turned ON.

For example, in one of the first phase and the second phase, charging from the capacitors C11 to C13 to the capacitors C21 to C24 is performed, and in the other of the first phase and the second phase, charging from the capacitors C14 to C16 to the capacitors C21 to C24 is performed.

In other words, because the capacitors C21 to C24 are constantly charged by the capacitors C11 to C13 or the capacitors C14 to C16, the nodes N1 to N4 are rapidly replenished with electric charges even if currents rapidly flow from the nodes N1 to N4 to the output switching circuit 88. Thus, potential variations at the nodes N1 to N4 can be suppressed.

As a result of operating in the above-described manner, the switched-capacitor circuit 87 is configured to maintain substantially equal voltages across each of the capacitors C21 to C24. Specifically, the voltages V41 to V44 (e.g., voltages with respect to the ground potential) satisfying V41:V42:V43:V44=1:2:3:4 are maintained at the four nodes N1 to N4. The levels of the voltages V41 to V44 correspond to a plurality of discrete voltage levels supplied to the output switching circuit 88 by the switched-capacitor circuit 87.

The voltage ratio V41:V42:V43:V44 is not limited to 1:2:3:4. For example, the voltage ratio V41:V42:V43:V44 may be 1:2:4:8.

The configuration of the switched-capacitor circuit 87 illustrated in FIG. 7 is an example. It is noted that the configuration of the switched-capacitor circuit 87 is not limited to the configuration illustrated in FIG. 7. In FIG. 7, the switched-capacitor circuit 87 is configured to supply voltages of four discrete voltage levels, but the configuration thereof is not limited to the configuration of supplying voltages of four discrete voltage levels. For example, the switched-capacitor circuit 87 can be configured to supply voltages of any number of two or more discrete voltage levels. For example, in a case where voltages of two discrete voltage levels are supplied, it is sufficient that the switched-capacitor circuit 87 include at least the capacitors C12 and C15 and the switches S21, S22, S31, S32, S23, S24, S33, and S34.

The switches included in the switched-capacitor circuit 87 are included in a tracker (not illustrated). Specifically, the tracker includes the plurality of switches S11 to S14, S21 to S24, S31 to S34, and S41 to S44.

(8.3) Output Switching Circuit

Next, the circuit configuration of the output switching circuit 88 will be described. As illustrated in FIG. 7, the output switching circuit 88 includes a plurality of (e.g., four in the illustrated example) input terminals 881 to 884, a plurality of (e.g., four in the illustrated example) switches S51 to S54, an output terminal 880, and a control terminal 885.

The output terminal 880 is connected to the PA 2 (see FIG. 6). The output terminal 880 is a terminal for supplying the PA 2 with a voltage selected from among the voltages V41 to V44.

The plurality of input terminals 881 to 884 are connected to the nodes N4 to N1 of the switched-capacitor circuit 87, respectively. The plurality of input terminals 881 to 884 are terminals for receiving the voltages V44 to V41 from the switched-capacitor circuit 87, respectively.

Moreover, the control terminal 885 is an input terminal for a digital control signal. Specifically, the control terminal 885 is a terminal for receiving a digital control signal indicating one of the voltages V41 to V44. The output switching circuit 88 controls ON/OFF of the plurality of switches S51 to S54 so as to select a voltage level indicated by the digital control signal.

The digital control signal received via the control terminal 885 includes, for example, two digital control logic/line (DCL) signals. The two DCL signals are each a 1-bit signal. One of the voltages V41 to V44 is indicated by a combination of the two 1-bit signals. For example, the voltages V41, V42, V43, and V44 are indicated by "00", "01", "10", and "11", respectively. A gray code may be used to express a voltage level. In the above case, two control terminals are provided to receive the two DCL signals. The number of DCL signals may be any number greater than or equal to one in accordance with the number of voltage levels. The DCL signal may be a signal of two or more bits. The digital control signal may be one or more DCL signals, or may be a control signal of the source synchronous scheme.

The switch S51 is connected between the input terminal 881 and the output terminal 880. Specifically, the switch S51 has a first terminal connected to the input terminal 881 and a second terminal connected to the output terminal 880. In this connection configuration, ON/OFF switching of the switch S51 enables switching between connection and disconnection between the input terminal 881 and the output terminal 880.

The switch S52 is connected between the input terminal 882 and the output terminal 880. Specifically, the switch S52 has a first terminal connected to the input terminal 882 and a second terminal connected to the output terminal 880. In this connection configuration, ON/OFF switching of the switch S52 enables switching between connection and disconnection between the input terminal 882 and the output terminal 880.

The switch S53 is connected between the input terminal 883 and the output terminal 880. Specifically, the switch S53 has a first terminal connected to the input terminal 883 and a second terminal connected to the output terminal 880. In this connection configuration, ON/OFF switching of the switch S53 enables switching between connection and disconnection between the input terminal 883 and the output terminal 880.

The switch S54 is connected between the input terminal 884 and the output terminal 880. Specifically, the switch S54 has a first terminal connected to the input terminal 884 and a second terminal connected to the output terminal 880. In this connection configuration, ON/OFF switching of the switch S54 enables switching between connection and disconnection between the input terminal 884 and the output terminal 880.

In operation, the plurality of switches S51 to S54 are controlled so as to be exclusively turned ON. In other words, only any one of the switches S51 to S54 is turned ON, and the others are turned OFF. Accordingly, the output switching circuit 88 is configured to output one voltage selected from among the voltages V41 to V44.

With the above-described configuration, the output switching circuit 88 receives a digital control signal corresponding to an envelope signal through the control terminal 885, controls ON/OFF of the plurality of switches S51 to S54 in response to the digital control signal received through the control terminal 885, and selects at least one of the plurality of voltages V41 to V44 generated by the switched-capacitor circuit 87. The output switching circuit 88 outputs the selected voltage.

The configuration of the output switching circuit 88 illustrated in FIG. 7 is an example. The configuration of the output switching circuit 88 is not limited to the configuration illustrated in FIG. 7. In particular, the switches S51 to S54 may have any configuration as long as any one of the four input terminals 881 to 884 can be selected and connected to the output terminal 880. For example, the output switching circuit 88 may further include a switch connected between a set of the switches S51 to S53 and a set of the switch S54 and the output terminal 880. For example, the output switching circuit 88 may further include a switch connected between a set of the switches S51 and S52 and a set of the switches S53 and S54 and the output terminal 880.

For example, when selecting one voltage from among voltages of two discrete voltage levels, it is sufficient that the output switching circuit 88 include at least the switches S52 and S53.

The output switching circuit 88 can be configured to output two or more voltages. In this case, it is sufficient that the output switching circuit 88 further include a necessary number of additional switch sets similar to the set of the switches S51 to S54 and additional output terminals.

The switches included in the output switching circuit 88 are included in the tracker (not illustrated). Specifically, the tracker includes the plurality of switches S51 to S54.

(8.4) Pre-Regulator Circuit

Next, the circuit configuration of the pre-regulator circuit 86 will be described. As illustrated in FIG. 7, the pre-regulator circuit 86 includes an input terminal 860, a plurality of (e.g., four in the illustrated example) output terminals 861 to 864, a plurality of inductor connection terminals 865 and 866, a control terminal 867, a plurality of (e.g., five in the illustrated example) switches S61, S62, S63, S71, and S72, a power inductor L71, and a plurality of capacitors C61, C62, C63, and C64.

The input terminal 860 is an input terminal for a DC voltage. Specifically, the input terminal 860 is a terminal for receiving an input voltage from the DC power supply 89 (see FIG. 6).

The output terminal 861 is an output terminal for the voltage V44. Specifically, the output terminal 861 is a terminal for supplying the voltage V44 to the switched-capacitor circuit 87. The output terminal 861 is connected to the node N4 of the switched-capacitor circuit 87.

The output terminal 862 is an output terminal for the voltage V43. Specifically, the output terminal 862 is a terminal for supplying the voltage V43 to the switched-capacitor circuit 87. The output terminal 862 is connected to the node N3 of the switched-capacitor circuit 87.

The output terminal 863 is an output terminal for the voltage V42. Specifically, the output terminal 863 is a terminal for supplying the voltage V42 to the switched-capacitor circuit 87. The output terminal 863 is connected to the node N2 of the switched-capacitor circuit 87.

The output terminal 864 is an output terminal for the voltage V41. Specifically, the output terminal 864 is a terminal for supplying the voltage V41 to the switched-capacitor circuit 87. The output terminal 864 is connected to the node N1 of the switched-capacitor circuit 87.

The inductor connection terminal 865 is connected to one end (first end) of the power inductor L71. The inductor connection terminal 866 is connected to the other end (second end) of the power inductor L71.

The control terminal 867 is an input terminal for a digital control signal. Specifically, the control terminal 867 is a terminal for receiving a digital control signal for controlling the pre-regulator circuit 86.

The switch S71 is connected between the input terminal 860 and the one end (first end) of the power inductor L71. Specifically, the switch S71 has a first terminal connected to the input terminal 860, and a second terminal connected to the one end of the power inductor L71 via the inductor connection terminal 865. In this connection configuration, ON/OFF switching of the switch S71 enables switching between connection and disconnection between the input terminal 860 and the one end of the power inductor L71.

The switch S72 is connected between the one end (first end) of the power inductor L71 and the ground. Specifically, the switch S72 has a first terminal connected to the one end of the power inductor L71 via the inductor connection terminal 865, and a second terminal connected to the ground. In this connection configuration, ON/OFF switching of the switch S72 enables switching between connection and disconnection between the one end of the power inductor L71 and the ground.

The switch S61 is connected between the other end (second end) of the power inductor L71 and the output terminal 861. Specifically, the switch S61 has a first terminal connected to the other end of power inductor L71, and a second terminal connected to the output terminal 861. In this connection configuration, ON/OFF switching of the switch S61 enables switching between connection and disconnection between the other end of the power inductor L71 and the output terminal 861.

The switch S62 is connected between the other end (second end) of the power inductor L71 and the output terminal 862. Specifically, the switch S62 has a first terminal connected to the other end of power inductor L71, and a second terminal connected to the output terminal 862. In this connection configuration, ON/OFF switching of the switch S62 enables switching between connection and disconnection between the other end of the power inductor L71 and the output terminal 862.

The switch S63 is connected between the other end (second end) of the power inductor L71 and the output terminal 863. Specifically, the switch S63 has a first terminal connected to the other end of power inductor L71, and a second terminal connected to the output terminal 863. In this connection configuration, ON/OFF switching of the switch S63 enables switching between connection and disconnection between the other end of the power inductor L71 and the output terminal 863.

The capacitor C61 is connected between the output terminal 861 and the output terminal 862. One of the two electrodes (first electrode) of the capacitor C61 is connected to the switch S61 and the output terminal 861, and the other of the two electrodes (second electrode) of the capacitor C61 is connected to the switch S62, the output terminal 862, and one of the two electrodes (first electrode) of the capacitor C62.

The capacitor C62 is connected between the output terminal 862 and the output terminal 863. The one of the two electrodes (first electrode) of the capacitor C62 is connected to the switch S62, the output terminal 862, and the other of the two electrodes (second electrode) of the capacitor C61, and the other of the two electrodes (second electrode) of the capacitor C62 is connected to the switch S63, the output terminal 863, and one of the two electrodes of the capacitor C63.

The capacitor C63 is connected between the output terminal 863 and the output terminal 864. The one of the two electrodes (first electrode) of the capacitor C63 is connected to the switch S63, the output terminal 863, and the other of the two electrodes (second electrode) of the capacitor C62, and the other of the two electrodes (second electrode) of the capacitor C63 is connected to the output terminal 864 and one of the two electrodes (first electrode) of the capacitor C64.

The capacitor C64 is connected between the output terminal 864 and the ground. The one of the two electrodes (first electrode) of the capacitor C64 is connected to the output terminal 864 and the other of the two electrodes (second electrode) of the capacitor C63, and the other of the two electrodes (second electrode) of the capacitor C64 is connected to the ground.

In operation, the plurality of switches S61 to S63 are controlled so as to be exclusively turned ON. In other words, only any one of the switches S61 to S63 is turned ON, and the others are turned OFF. Turning ON of any one of the switches S61 to S63 enables the levels of the voltages V41 to V44 to be changed.

The pre-regulator circuit 86 configured as described above is configured to supply electric charge to the switched-capacitor circuit 87 via at least one of the plurality of output terminals 861 to 864.

The switches included in the pre-regulator circuit 86 are mounted in the tracker (not illustrated). Specifically, the tracker includes the plurality of switches S61 to S63, S71, and S72.

(9) Operation of RF Module

Next, an operation of supplying the power supply voltage V1 to the first PA 2 and the second PA 3 in the RF module 1 according to the first embodiment will be described with reference to FIG. 1 and FIG. 2. The first PA 2 and the second PA 3 that are supplied with the power supply voltage V1 from the tracker component 85 support a first communication band and a second communication band.

First, a description will be given of a case where the common terminal 61 is connected to the selection terminal 62 in the switch 6. The power supply voltage V1 output from the tracker component 85 is directly supplied to the first PA 2 because the filter 5 is not disposed on the first path P1. In response to being supplied with the power supply voltage V1, the first PA 2 amplifies an RF signal.

Next, a description will be given of a case where the common terminal 61 is connected to the selection terminal 63 or 64 in the switch 6. The power supply voltage V1 output from the tracker component 85 passes through the filter 5 (e.g., filter 5a or 5b in FIG. 2) because the filter 5 is disposed on the second path P2 (e.g., second path P21 or P22 in FIG. 2). The filter 5 reduces harmonic components of the power supply voltage V1. Specifically, the filter 5 is configured to cut harmonic components of the power supply voltage V1 and allow fundamental wave components of the power supply voltage V1 to pass therethrough. Thereafter, the power supply voltage V1 that has passed through the filter 5 is supplied to the second PA 3. In response to being supplied with the power supply voltage V1, the second PA 3 amplifies an RF signal.

As described above, the switching between the first path P1 not provided with the filter 5 and the second path P2 provided with the filter 5 by the switch 6 makes it possible to switch whether to allow the power supply voltage V1 from the tracker component 85 to pass through the filter 5. In other words, it is possible to switch whether to remove harmonic components of the power supply voltage V1.

When the second PA 3 amplifies an FDD transmission signal, harmonic components of the power supply voltage V1 can be reduced by the filter 5, and thus noise to an FDD reception signal can be reduced. On the other hand, in a case where the first PA 2 amplifies a TDD transmission signal, the power supply voltage V1 remains as is.

(10) Advantageous Effects

In the RF module 1 according to the first exemplary embodiment, the filter 5 is disposed on the second path P2 between the external connection terminal 4 and the second PA 3 of the first PA 2 and the second PA 3. Accordingly, in the case of supplying the power supply voltage V1 to a plurality of PAs, the necessity or unnecessity of the filter 5 can be changed according to a PA. Thus, both low loss and a favorable attenuation characteristic can be achieved in each PA.

Modifications

Hereinafter, modifications of the first exemplary embodiment will be described.

First Modification

Figure 8:
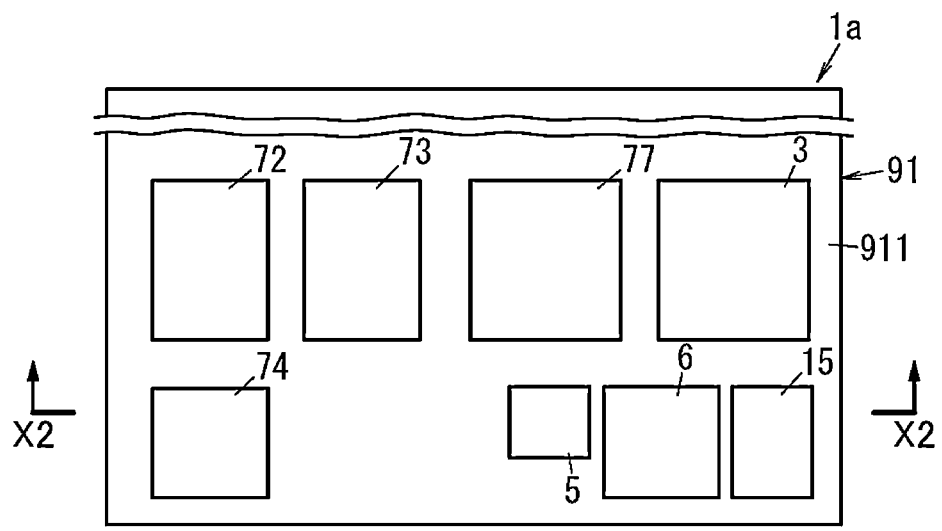
FIG. 8 is a front view of an RF module according to a first modification of the first exemplary embodiment.
Figure 9:
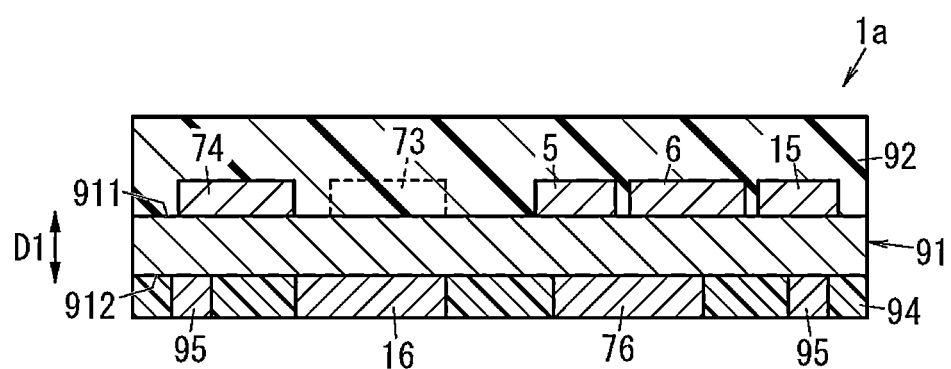
FIG. 9 is a sectional view of the RF module according to the first modification of the first exemplary embodiment taken along the line X2-X2 in FIG. 8.
Figure 10:
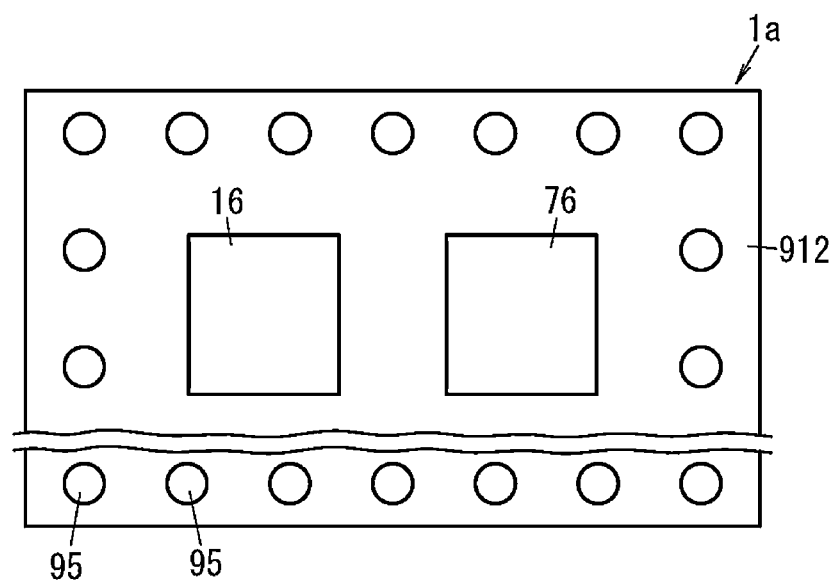
FIG. 10 is a rear view of the RF module according to the first modification of the first exemplary embodiment.

In a first modification of the first exemplary embodiment, an RF module 1a may have a double-sided mounting structure as illustrated in FIG. 8 to FIG. 10 instead of a single-sided mounting structure.

As illustrated in FIG. 9 and FIG. 10, the RF module 1a according to the first modification includes a plurality of external connection terminals 95 instead of the plurality of external connection terminals 93.

Each external connection terminal 95 does not have a bump structure but has a pillar-shaped (for example, columnar) electrode. The plurality of external connection terminals 95 are disposed on the second main surface 912 of the mounting substrate 91. According to exemplary aspects, the material of the plurality of external connection terminals 95 is, for example, metal (copper, copper alloy, or the like). Each external connection terminal 95 has a base end portion joined to the second main surface 912 of the mounting substrate 91 and a distal end portion opposite to the base end portion in the thickness direction D1 of the mounting substrate 91. The distal end portion of each external connection terminal 95 may include, for example, a gold plating layer.

The RF module 1a according to the first modification includes a resin member 94 that covers the second main surface 912 of the mounting substrate 91.

(2) Second Modification

Figure 11:
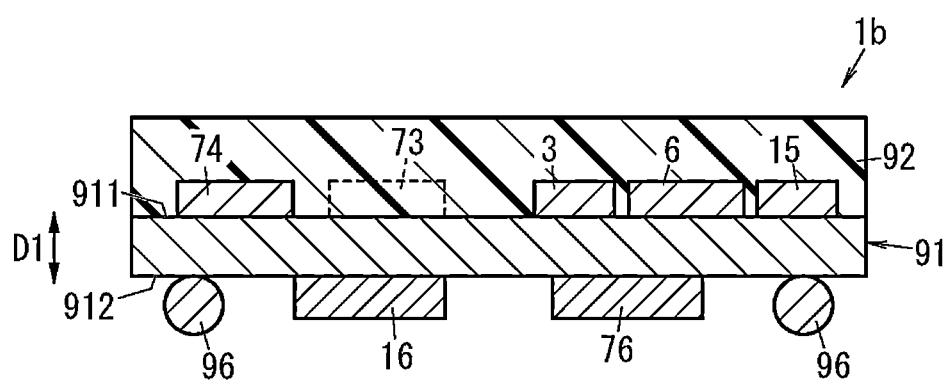
FIG. 11 is a sectional view of an RF module according to a second modification of the first exemplary embodiment.

In a second modification of the first exemplary embodiment, an RF module 1b may have the structure illustrated in FIG. 11.

The RF module 1b includes a plurality of external connection terminals 96 having a bump structure instead of the pillar-shaped external connection terminals 95. In FIG. 11 illustrating the RF module 1b, the illustration of the resin member 94 (see FIG. 9) is omitted.

(3) Third Modification

Figure 12:
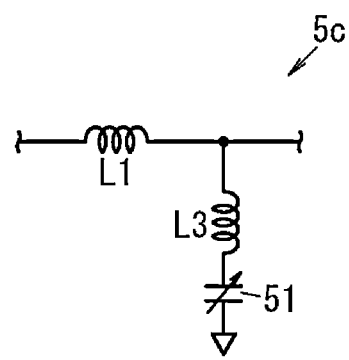
FIG. 12 is a circuit diagram of a filter of an RF module according to a third modification of the first exemplary embodiment.

In a third modification of the first exemplary embodiment, a filter 5c illustrated in FIG. 12, which is a variable filter, may be employed. The filter 5c illustrated in FIG. 12 is a variable low pass filter. The filter 5c includes inductors L1 and L3 and a digitally tunable capacitor (DTC) 51.

In the RF module 1 according to the third modification, the low pass filter serving as the filter 5c disposed on the second path P2 is a variable low pass filter. Accordingly, in a case where the second PA 3 amplifies RF signals of a plurality of communication bands, the characteristics of the filter 5c can be changed in accordance with a communication band. As a result, favorable characteristics are obtained for each communication band.

(4) Fourth Modification

In the RF module 1 according to a fourth modification, the first PA 2 and the second PA 3 may be integrated with the filter 5 into one package. Of the first PA 2 and the second PA 3, only the first PA 2 may be integrated with the filter 5 into one package. Alternatively, of the first PA 2 and the second PA 3, only the second PA 3 may be integrated with the filter 5 into one package. In short, at least one of the first PA 2 and the second PA 3 may be integrated with the filter 5 into one package. In other words, the filter 5 and at least one of the first PA 2 and the second PA 3 constitute one component.

The first PA 2 and the second PA 3 may be disposed adjacent to at least a part of the filter 5. For purposes of this disclosure, the phrase "the first PA 2 and the second PA 3 are disposed adjacent to at least a part of the filter 5" means that the first PA 2 and the second PA 3 are disposed in the package in a state in which no other elements are disposed between the first PA 2 and a part of the filter 5 or between the second PA 3 and a part of the filter 5.

(5) Additional Modifications

In another modification of the first exemplary embodiment, the filter 5 may be a notch filter (e.g., a band elimination filter) instead of a low pass filter.

In the first embodiment, the combination of the communication band of a TDD RF signal and the communication band of an FDD RF signal is a combination of n41, which is a frequency band for 5G NR, and Band 30, which is a frequency band for 3GPP, but the combination is not limited thereto. The combination of the communication band of a TDD RF signal and the communication band of an FDD RF signal may be, for example, a combination of n38, which is a frequency band for 5G NR, and Band 30, which is a frequency band for 3GPP.

In another modification of the first exemplary embodiment, the duplexers 72 and 73, the first transmission filter 74, and the first reception filter 75 are not limited to SAW filters, and may be filters other than SAW filters. The duplexers 72 and 73, the first transmission filter 74, and the first reception filter 75 may be, for example, acoustic wave filters using a bulk acoustic wave (BAW), LC resonance filters, or dielectric filters.

Second Exemplary Embodiment

In the second exemplary embodiment, a tracker module 85a will be described with reference to the FIG. 13.

Configuration

Figure 13:
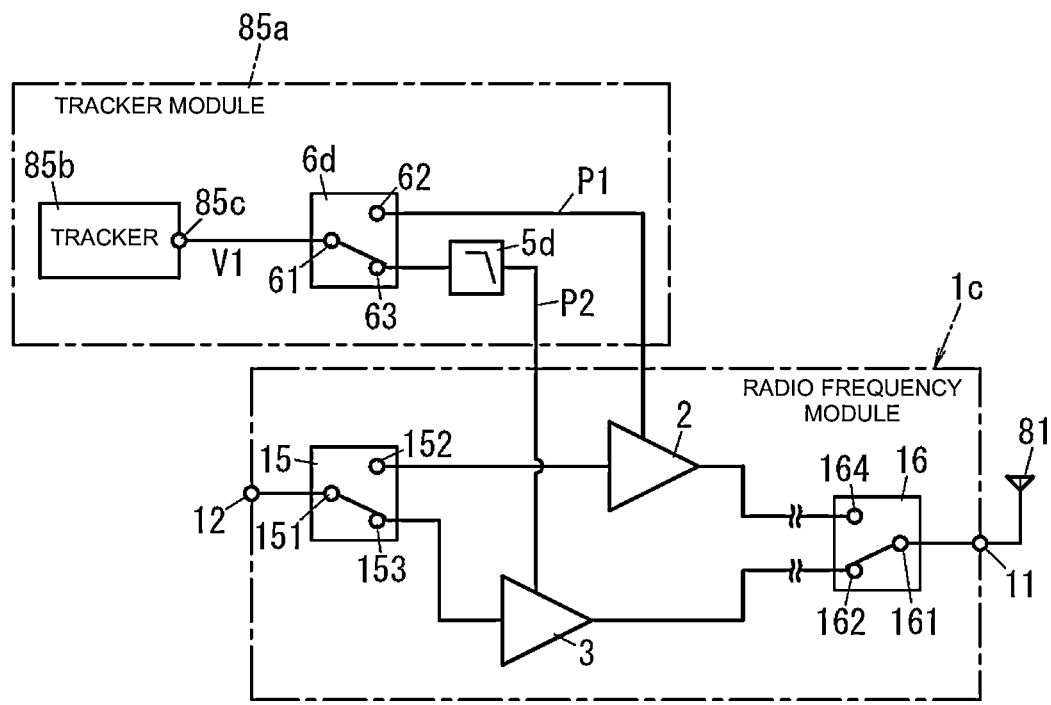
FIG. 13 is a schematic diagram illustrating the configuration of a tracker module according to a second exemplary embodiment.

As illustrated in FIG. 13, the tracker module 85a according to the second embodiment includes a tracker 85b, a filter 5d, and a switch 6d.

As illustrated in FIG. 13, the tracker 85b has an output terminal 85c and is configured to supply the power supply voltage V1 to the first PA 2 and the second PA 3. More specifically, the tracker 85b generates the power supply voltage V1 having a level corresponding to an envelope extracted from a modulated signal of an RF signal, and supplies the power supply voltage V1 to an RF module 1c.

The tracker 85b is configured to change the amplitude of the power supply voltage V1 in response to a power supply control signal from the signal processing circuit 82 (see FIG. 2). In other words, the tracker 85b is an envelope tracking circuit configured to generate the power supply voltage V1 that varies in accordance with the envelope of the amplitude of an RF signal output from the signal processing circuit 82. The tracker 85b includes, for example, a DC-DC converter, detects the amplitude level of the RF signal from an I-phase signal and a Q-phase signal, and generates the power supply voltage V1 by using the detected amplitude level.

Accordingly, the tracker 85b supplies the power supply voltage V1 to the RF module 1c by using the ET method.

As illustrated in FIG. 13, the filter 5d is not disposed on the first path P1 between the output terminal 85c of the tracker 85b and the first PA 2, but is disposed on the second path P2 between the output terminal 85c of the tracker 85b and the second PA 3.

The filter 5d is, for example, a low pass filter, and reduces harmonic components of the power supply voltage V1. Accordingly, noise resulting from the power supply voltage V1 can be reduced.

The filter 5d includes, for example, the inductor L1, the first capacitor C1, the second capacitor C2, and the third capacitor C3 (see FIG. 3) similarly to the filter 5 according to the first embodiment (see FIG. 3). The filter 5d is, for example, a so-called LC filter including an inductor and a capacitor as main components.

As illustrated in FIG. 13, the switch 6d is a switch for switching the path to be connected to the output terminal 85c of the tracker 85b. In other words, the switch 6d is configured to switch the connection to the output terminal 85c of the tracker 85b between the first path P1 and the second path P2.

The switch 6d has a common terminal 61 and a plurality of (e.g., two in the illustrated example) selection terminals 62 and 63. The common terminal 61 is connected to the output terminal 85c of the tracker 85b. The selection terminal 62 is connected to the first PA 2. The selection terminal 63 is connected to the second PA 3 via the filter 5d.

According to the exemplary aspect, the switch 6d is configured to connect at least one of the plurality of selection terminals 62 and 63 to the common terminal 61. The switch 6d is, for example, a switch IC. The switch 6d is, for example, controlled by the signal processing circuit 82 (see FIG. 2). The switch 6d switches the connection state between the common terminal 61 and the plurality of selection terminals 62 and 63 in response to a control signal from the RF signal processing circuit 84 (see FIG. 2) of the signal processing circuit 82.

In the second embodiment, the tracker 85b is integrated with the filter 5d into one package. In other words, the tracker 85b and the filter 5d constitute one component.

(2) Advantageous Effects

With the tracker module 85a according to the second exemplary embodiment, when supplying the power supply voltage V1 to a plurality of PAs (e.g., the first PA 2 and the second PA 3), the necessity or unnecessity of the filter 5d can be changed according to a PA. Thus, both low loss and a favorable attenuation characteristic can be achieved in each PA.

In general, it is noted that the exemplary embodiments and modifications described above are merely some of various embodiments and modifications of the present invention. The embodiments and modifications can be variously changed according to design or the like as long as the object of the present invention can be achieved.

Exemplary Aspects

The specification discloses the following exemplary aspects.

A radio frequency module (1; 1a; 1b) according to a first exemplary aspect includes a plurality of power amplifiers, an external connection terminal (4), a filter (5; 5c), and a switch (6). The plurality of power amplifiers include a first power amplifier (2) and a second power amplifier (3). The external connection terminal (4) is connected to a tracker component (85) configured to supply a power supply voltage (V1) to the plurality of power amplifiers. The filter (5; 5c) is not disposed on a first path (P1) between the external connection terminal (4) and the first power amplifier (2), but instead it is disposed on a second path (P2) between the external connection terminal (4) and the second power amplifier (3). The switch (6) is configured to switch connection to the external connection terminal (4) between the first path (P1) and the second path (P2).

With the radio frequency module (1; 1a; 1b) according to the first exemplary aspect, when supplying the power supply voltage (V1) to the plurality of power amplifiers (the first power amplifier (2) and the second power amplifier (3)), the necessity or unnecessity of the filter (5) can be changed according to a power amplifier. Thus, both low loss and a favorable attenuation characteristic are achieved in each power amplifier.

In a radio frequency module (1; 1a; 1b) according to a second exemplary aspect, in the first aspect, the first power amplifier (2) is configured to amplify a time division duplex (TDD) radio frequency signal. The second power amplifier (3) is configured to amplify a frequency division duplex (FDD) radio frequency signal.

In a radio frequency module (1; 1a; 1b) according to a third exemplary aspect, in the second aspect, the TDD radio frequency signal has a communication band that is n41. The FDD radio frequency signal has a communication band that is Band 30.

In a radio frequency module (1; 1a; 1b) according to a fourth exemplary aspect, in the second aspect, the TDD radio frequency signal has a communication band that is n38. The FDD radio frequency signal has a communication band that is Band 30.

In a radio frequency module (1; 1a; 1b) according to a fifth exemplary aspect, in any one of the first to fourth aspects, the filter (5) is a low pass filter.

In a radio frequency module (1; 1a; 1b) according to a sixth exemplary aspect, in the fifth aspect, the low pass filter is a variable low pass filter.

With the radio frequency module (1; 1a; 1b) according to the sixth aspect, in a case where the second power amplifier (3) amplifies radio frequency signals of a plurality of communication bands, the characteristics of the filter (5) are changed in accordance with a communication band. As a result, favorable characteristics are obtained for each communication band.

In a radio frequency module (1; 1a; 1b) according to a seventh exemplary aspect, in any one of the first to sixth aspects, the power supply voltage (V1) is a power supply voltage generated by using an envelope tracking method.

A communication device (8) according to an eighth exemplary aspect includes the radio frequency module (1; 1a; 1b) according to any one of the first to seventh aspects, and a signal processing circuit (82). The signal processing circuit (82) is configured to output a radio frequency signal to the radio frequency module (1; 1a; 1b).

With the communication device (8) according to the eighth aspect, when supplying the power supply voltage (V1) to the plurality of power amplifiers (the first power amplifier (2) and the second power amplifier (3)) in the radio frequency module (1; 1a; 1b), the necessity or unnecessity of the filter (5) can be changed according to a power amplifier. Thus, both low loss and a favorable attenuation characteristic are achieved in each power amplifier.

In a radio frequency module (1; 1a; 1b) according to a ninth exemplary aspect, in the first aspect, at least one of the first power amplifier (2) and the second power amplifier (3) is integrated with the filter (5; 5c) into one package.

In a radio frequency module (1; 1a; 1b) according to a tenth exemplary aspect, in the ninth aspect, the first power amplifier (2) and the second power amplifier (3) are disposed adjacent to at least a part of the filter (5; 5c).

A radio frequency circuit according to an eleventh exemplary aspect includes a plurality of power amplifiers, an external connection terminal (4), a filter (5; 5c), and a switch (6). The plurality of power amplifiers include a first power amplifier (2) and a second power amplifier (3). The external connection terminal (4) is connected to a tracker circuit configured to supply a power supply voltage (V1) to the plurality of power amplifiers. The filter (5; 5c) is not disposed on a first path (P1) between the external connection terminal (4) and the first power amplifier (2) but is disposed on a second path (P2) between the external connection terminal (4) and the second power amplifier (3). The switch (6) is configured to switch connection to the external connection terminal (4) between the first path (P1) and the second path (P2).

In a radio frequency circuit according to a twelfth exemplary aspect, in the eleventh aspect, the first power amplifier (2) is configured to amplify a time division duplex (TDD) radio frequency signal. The second power amplifier (3) is configured to amplify a frequency division duplex (FDD) radio frequency signal.

In a radio frequency circuit according to a thirteenth exemplary aspect, in the eleventh aspect, the first power amplifier (2) is configured to amplify a first radio frequency signal. The second power amplifier (3) is configured to amplify a second radio frequency signal having a frequency band narrower than a frequency band of the first radio frequency signal.

In a radio frequency circuit according to a fourteenth exemplary aspect, in any one of the eleventh to thirteenth aspects, the filter (5; 5c) is a low pass filter.

In a radio frequency circuit according to a fifteenth exemplary aspect, in the fourteenth aspect, the filter (5; 5c) includes an inductor (L1) and a capacitor (C2; C3; 51). The inductor (L1) is disposed on the second path (P2). The capacitor (C2; C3; 51) is connected between the second path (P2) and a ground.

In a radio frequency circuit according to a sixteenth exemplary aspect, in the fourteenth or fifteenth aspect, the low pass filter is a variable low pass filter.

In a radio frequency circuit according to a seventeenth exemplary aspect, in any one of the eleventh to sixteenth aspects, the tracker circuit is configured to supply a rectangular wave voltage.

A tracker module (85a) according to an eighteenth exemplary aspect includes a tracker (85b), a filter (5d), and a switch (6d). The tracker (85b) has an output terminal (85c) and is configured to supply a power supply voltage (V1) to a first power amplifier (2) and a second power amplifier (3). The filter (5d) is not disposed on a first path (P1) between the output terminal (85c) of the tracker (85b) and the first power amplifier (2) but is disposed on a second path (P2) between the output terminal (85c) of the tracker (85b) and the second power amplifier (P2). The switch (6d) is configured to switch connection to the output terminal (85c) of the tracker (85b) between the first path (P1) and the second path (P2).

With the tracker module (85a) according to the eighteenth exemplary aspect, in the case of supplying the power supply voltage (V1) to the plurality of power amplifiers (the first power amplifier (2) and the second power amplifier (3)), the necessity or unnecessity of the filter (5d) can be changed according to a power amplifier. Thus, both low loss and a favorable attenuation characteristic are achieved in each power amplifier.

In a tracker module (85a) according to a nineteenth exemplary aspect, in the eighteenth aspect, the tracker (85b) is integrated with the filter (5d) into one package.

In a tracker module (85a) according to a twentieth exemplary aspect, in the eighteenth or nineteenth aspect, the filter (5d) is a low pass filter.

What is claimed:
1. A radio frequency module comprising:
a plurality of power amplifiers including a first power amplifier and a second power amplifier;
an external connection terminal connected to a tracker component that is configured to supply a power supply voltage to the plurality of power amplifiers;
a filter that is disposed on a second path between the external connection terminal and the second power amplifier, such that the filter is not disposed on a first path between the external connection terminal and the first power amplifier; and
a switch configured to switch a connection of the external connection terminal between the first path and the second path.

2. The radio frequency module according to claim 1, wherein:
the first power amplifier is configured to amplify a time division duplex (TDD) radio frequency signal, and
the second power amplifier is configured to amplify a frequency division duplex (FDD) radio frequency signal.

3. The radio frequency module according to claim 2, wherein:
the TDD radio frequency signal has a communication band that is n41, and
the FDD radio frequency signal has a communication band that is Band 30.

4. The radio frequency module according to claim 2, wherein:
the TDD radio frequency signal has a communication band that is n38, and
the FDD radio frequency signal has a communication band that is Band 30.

5. The radio frequency module according to claim 1, wherein the filter is a low pass filter.

6. The radio frequency module according to claim 5, wherein the low pass filter is a variable low pass filter.

7. The radio frequency module according to claim 1, wherein the power supply voltage is generated using an envelope tracking method.

8. A communication device comprising:
the radio frequency module according to claim 1; and
a signal processing circuit configured to output a radio frequency signal to the radio frequency module.

9. The radio frequency module according to claim 1, wherein at least one of the first power amplifier and the second power amplifier is integrated with the filter into a single package.

10. The radio frequency module according to claim 9, wherein the first power amplifier and the second power amplifier are disposed adjacent to at least a part of the filter.

11. A radio frequency circuit comprising:
a plurality of power amplifiers including a first power amplifier and a second power amplifier;
an external connection terminal connected to a tracker circuit that is configured to supply a power supply voltage to the plurality of power amplifiers;
a filter that is disposed on a second path between the external connection terminal and the second power amplifier, such that the filter is not disposed on a first path between the external connection terminal and the first power amplifier; and
a switch configured to switch a connection of the external connection terminal between the first path and the second path.

12. The radio frequency circuit according to claim 11, wherein:
the first power amplifier is configured to amplify a time division duplex (TDD) radio frequency signal, and the second power amplifier is configured to amplify a frequency division duplex (FDD) radio frequency signal.

13. The radio frequency circuit according to claim 11, wherein:
the first power amplifier is configured to amplify a first radio frequency signal, and
the second power amplifier is configured to amplify a second radio frequency signal having a frequency band narrower than a frequency band of the first radio frequency signal.

14. The radio frequency circuit according to claim 11, wherein the filter is a low pass filter.

15. The radio frequency circuit according to claim 11, wherein the filter includes:
an inductor disposed on the second path, and
a capacitor connected between the second path and a ground connection.

16. The radio frequency circuit according to claim 14, wherein the low pass filter is a variable low pass filter.

17. The radio frequency circuit according to claim 11, wherein the tracker circuit is configured to supply a rectangular wave voltage.

18. A tracker module comprising:
a tracker having an output terminal and configured to supply a power supply voltage to a first power amplifier and a second power amplifier;
a filter that is disposed on a second path between the output terminal of the tracker and the second power amplifier, such that the filter is not disposed on a first path between the output terminal and the first power amplifier; and
a switch configured to switch a connection of the output terminal of the tracker between the first path and the second path.

19. The tracker module according to claim 18, wherein the tracker is integrated with the filter into a single package.

20. The tracker module according to claim 18, wherein the filter is a low pass filter.

* * * * *